(12) United States Patent
Sekine

(10) Patent No.: US 9,548,308 B2
(45) Date of Patent: Jan. 17, 2017

(54) SEMICONDUCTOR DEVICE

(71) Applicant: Semiconductor Energy Laboratory Co., Ltd., Atsugi-shi, Kanagawa-ken (JP)

(72) Inventor: Yusuke Sekine, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/044,180

(22) Filed: Feb. 16, 2016

(65) Prior Publication Data

US 2016/0163710 A1 Jun. 9, 2016

Related U.S. Application Data

(62) Division of application No. 14/447,897, filed on Jul. 31, 2014, now Pat. No. 9,287,266, which is a division
(Continued)

(30) Foreign Application Priority Data

Apr. 22, 2011 (JP) .................................. 2011-096622
May 14, 2011 (JP) .................................. 2011-108900

(51) Int. Cl.
*G11C 11/00* (2006.01)
*H01L 27/105* (2006.01)
(Continued)

(52) U.S. Cl.
CPC ......... *H01L 27/1052* (2013.01); *G11C 11/412* (2013.01); *G11C 11/4125* (2013.01);
(Continued)

(58) Field of Classification Search
CPC .... G11C 11/412; G11C 11/4125; G11C 7/106; G11C 13/004; G11C 13/0069; G11C 2013/0078
(Continued)

(56) References Cited

U.S. PATENT DOCUMENTS 4,466,081 A 8/1984 Masuoka
4,485,317 A * 11/1984 Davies, Jr. ....... H03K 19/01855
326/71
(Continued)

FOREIGN PATENT DOCUMENTS

EP 1737044 A 12/2006
EP 2226847 A 9/2010
(Continued)

OTHER PUBLICATIONS

Ishii.T et al., "A Poly-Silicon TFT With a Sub-5-nm Thick Channel for Low-Power Gain Cell Memory in Mobile Applications", IEEE Transactions on Electron Devices, Nov. 1, 2004, vol. 51, No. 11, pp. 1805-1810.
(Continued)

*Primary Examiner* — Gene Auduong
(74) *Attorney, Agent, or Firm* — Fish & Richardson P.C.

(57) ABSTRACT

A nonvolatile memory is provided. A semiconductor device (a nonvolatile memory) has a circuit configuration similar to that of a general SRAM. By providing a transistor whose off-state current is small between a stored data holding portion and a power supply line of the SRAM, leakage of electric charge from the stored data holding portion is prevented. As the transistor whose off-state current is small provided for preventing leakage of electric charge from the stored data holding portion, a transistor including an oxide semiconductor film is preferably used. Such a configuration
(Continued)

can also be applied to a shift register, whereby a shift register with low power consumption can be obtained.

3 Claims, 20 Drawing Sheets

Related U.S. Application Data of application No. 13/449,602, filed on Apr. 18, 2012, now Pat. No. 8,797,788.

(51) Int. Cl.

| | |
|---|---|
| G11C 11/412 | (2006.01) |
| H01L 27/11 | (2006.01) |
| H01L 27/02 | (2006.01) |
| H01L 27/092 | (2006.01) |
| H01L 27/12 | (2006.01) |
| H01L 29/786 | (2006.01) |

(52) U.S. Cl.
CPC ........ *H01L 27/0207* (2013.01); *H01L 27/092* (2013.01); *H01L 27/1108* (2013.01); *H01L 27/1207* (2013.01); *H01L 29/7869* (2013.01)

(58) Field of Classification Search
USPC ............... 365/154, 156, 63, 202, 189.14
See application file for complete search history.

(56) References Cited

U.S. PATENT DOCUMENTS

| | | | |
|---|---|---|---|
| 5,311,070 A * | 5/1994 | Dooley | G11C 11/4125 |
| | | | 326/121 |
| 5,349,366 A | 9/1994 | Yamazaki et al. | |
| 5,528,032 A | 6/1996 | Uchiyama | |
| 5,648,930 A | 7/1997 | Randazzo | |
| 5,731,856 A | 3/1998 | Kim et al. | |
| 5,744,864 A | 4/1998 | Cillessen et al. | |
| 5,852,572 A | 12/1998 | Jung et al. | |
| 6,127,702 A | 10/2000 | Yamazaki et al. | |
| 6,172,907 B1 | 1/2001 | Jenne | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,774,876 B2 | 8/2004 | Inukai | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,286,390 B2 | 10/2007 | Yokoyama | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,436,694 B2 | 10/2008 | Berthold et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,511,988 B2 | 3/2009 | Lin et al. | |
| 7,674,650 B2 | 3/2010 | Akimoto et al. | |
| 7,732,819 B2 | 6/2010 | Akimoto et al. | |
| 7,746,695 B2 | 6/2010 | Ivanov et al. | |
| 7,863,611 B2 | 1/2011 | Abe et al. | |
| 8,169,814 B2 | 5/2012 | Chuang et al. | |
| 8,203,146 B2 | 6/2012 | Abe et al. | |
| 8,363,455 B2 * | 1/2013 | Rennie | G11C 11/412 |
| | | | 365/154 |
| 8,760,912 B2 * | 6/2014 | Rennie | G11C 11/412 |
| | | | 365/154 |

| | | |
|---|---|---|
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0141363 A1 | 7/2004 | Ohtsuka et al. |
| 2005/0017302 A1 | 1/2005 | Hoffman |
| 2005/0083291 A1 | 4/2005 | Chung et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0002590 A1 | 1/2009 | Kimura |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0097838 A1 | 4/2010 | Tanaka et al. |
| 2010/0109002 A1 | 5/2010 | Itagaki et al. |
| 2010/0148171 A1 | 6/2010 | Hayashi et al. |
| 2010/0193785 A1 | 8/2010 | Kimura |

(56) References Cited

U.S. PATENT DOCUMENTS

| | | |
|---|---|---|
| 2010/0302832 A1 | 12/2010 | Berger et al. |
| 2011/0057918 A1 | 3/2011 | Kimura et al. |
| 2011/0085635 A1 | 4/2011 | Koyama |
| 2011/0089419 A1 | 4/2011 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-210996 A | 8/1993 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-122873 A | 5/2005 |
| JP | 2006-165532 A | 6/2006 |
| JP | 2006-196124 A | 7/2006 |
| JP | 2007-096055 A | 4/2007 |
| JP | 2007-123861 A | 5/2007 |
| JP | 2011-076079 A | 4/2011 |
| WO | WO-2004/114391 | 12/2004 |

OTHER PUBLICATIONS

Kim.W et al., "An Experimental High-Density DRAM Cell with a Built-in Gain Stage", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's", IEEE Transactions on Electron Devices, Jun. 1, 1994, vol. 41, No. 6, pp. 926-931.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20,2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

(56) References Cited

OTHER PUBLICATIONS

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5Δ) Flexible Full Color Top Emission AMOLED Display on Plastic Film and Its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by PEALD Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N et al., "SPINEL, YbFe2O4, and Yb2Fe3O7 Types of Structures for Compounds in the In2O3 and Sc2O3-A2O3-A2O3-BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst, Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

\* cited by examiner

● In
☾ Sn
☾ Zn
● O

- In
- Ga
- Zn
- O

FIG. 12A $$\mu = \mu_0 \exp(-\frac{E}{kT})$$

FIG. 12B $$E = \frac{e^2 N^2}{8\varepsilon n} = \frac{e^3 N^2 t}{8\varepsilon C_{ox} V_g}$$

FIG. 12C $$I_d = \frac{W \mu V_g V_d C_{ox}}{L} \exp(-\frac{E}{kT})$$

FIG. 12D $$\ln(\frac{I_d}{V_g}) = \ln(\frac{W \mu V_d C_{ox}}{L}) - \frac{E}{kT} = \ln(\frac{W \mu V_d C_{ox}}{L}) - \frac{e^3 N^2 t}{8kT \varepsilon C_{ox} V_g}$$

FIG. 12E $$\frac{1}{\mu_1} = \frac{1}{\mu_0} + \frac{D}{B}\exp(-\frac{x}{G})$$

SEMICONDUCTOR DEVICE

CROSS-REFERENCE TO RELATED APPLICATIONS

This application is a divisional of U.S. application Ser. No. 14/447,897, filed Jul. 31, 2014, now allowed, which is a divisional of U.S. application Ser. No. 13/449,602, filed Apr. 18, 2012, now U.S. Pat. No. 8,797,788, which claims the benefit of foreign priority applications filed in Japan as Serial No. 2011-096622 on Apr. 22, 2011, and Serial No. 2011-108900 on May 14, 2011, all of which are incorporated by reference.

BACKGROUND OF THE INVENTION

1. Field of the Invention

The present invention relates to a semiconductor device. In this specification, a semiconductor device refers to a semiconductor element itself or a device including a semiconductor element. Examples of such a semiconductor element include, for example, a thin film transistor. Accordingly, a semiconductor device also includes a device such as a liquid crystal display device in its category.

2. Description of the Related Art

As one kind of a volatile memory, a static random access memory (SRAM) is widely known.

Meanwhile, in recent years, a metal oxide having semiconductor characteristics (hereinafter referred to as an oxide semiconductor) has attracted attention. An oxide semiconductor can be applied to a transistor (see Patent Documents 1 and 2).

REFERENCE

Patent Document

[Patent Document 1] Japanese Published Patent Application No. 2007-123861
[Patent Document 2] Japanese Published Patent Application No. 2007-096055

SUMMARY OF THE INVENTION

It is an object of an embodiment of the present invention to provide a semiconductor device including a nonvolatile memory.

An embodiment of the present invention is a semiconductor device (a nonvolatile memory) having a circuit configuration similar to that of a general SRAM. By providing a transistor whose off-state current is small between a stored data holding portion and a power supply potential line of the SRAM, leakage of electric charge from the stored data holding portion is prevented. As the transistor whose off-state current is small, for example, a transistor in which a channel formation region is formed using an oxide semiconductor layer may be used.

Note that in the drawings, in order to express a very small off-state current of a transistor in which a channel formation region is formed using an oxide semiconductor layer, part of the transistor is indicated by a dashed line.

In accordance with an embodiment of the present invention, it is possible to provide a semiconductor device including a nonvolatile memory.

BRIEF DESCRIPTION OF THE DRAWINGS

FIGS. 12A to 12E are equations for calculating the mobility.

DETAILED DESCRIPTION OF THE INVENTION

Hereinafter, embodiments of the present invention will be described in detail with reference to the accompanying drawings. Note that the present invention is not limited to the following description and it is easily understood by those skilled in the art that modes and details thereof can be variously changed without departing from the spirit and the scope of the present invention. Accordingly, the present invention should not be construed as being limited to the description of the embodiments below.

Embodiment 1

First, examples of a configuration of a nonvolatile memory according to an embodiment of the present invention will be described.

Figure 1A:
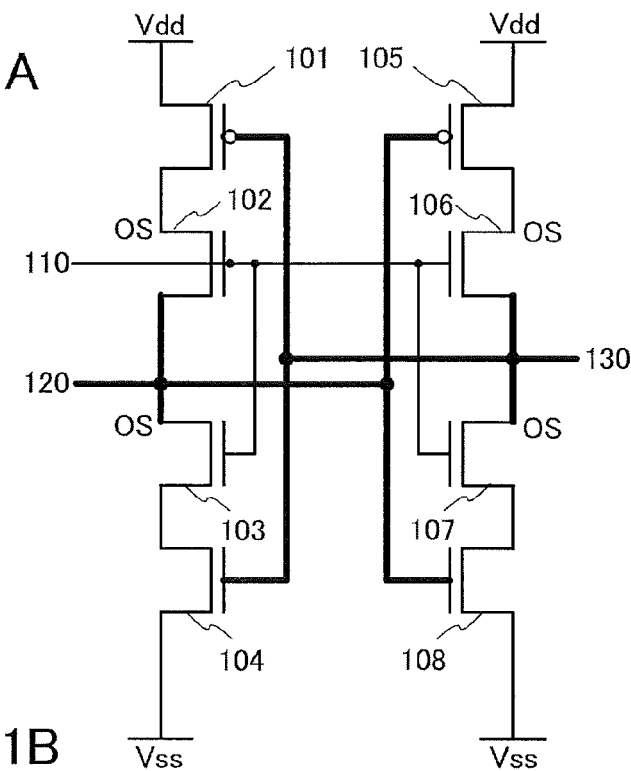
FIGS. 1A and 1B are circuit diagrams each illustrating an example of a nonvolatile memory according to an embodiment of the present invention.

FIG. 1A illustrates an example of a configuration of a nonvolatile memory according to an embodiment of the present invention. The nonvolatile memory illustrated in FIG. 1A includes first to eighth transistors. The first to fourth transistors are electrically connected to each other in series in that order. The fifth to eighth transistors are electrically connected to each other in series in that order. One of a source and a drain of the first transistor 101 is electrically connected to a high power supply potential line. One of a source and a drain of the fourth transistor 104 is electrically connected to a low power supply potential line. One of a source and a drain of the fifth transistor 105 is electrically connected to the high power supply potential line. One of a source and a drain of the eighth transistor 108 is electrically connected to the low power supply potential line. A gate of the first transistor 101 and a gate of the fourth transistor 104 are electrically connected to a third terminal 130. The third terminal 130 is electrically connected between one of a source and a drain of the sixth transistor 106 and one of a source and a drain of the seventh transistor 107. A gate of the fifth transistor 105 and a gate of the eighth transistor 108 are electrically connected to a second terminal 120. The second terminal 120 is electrically connected between one of a source and a drain of the second transistor 102 and one of a source and a drain of the third transistor 103. A gate of the second transistor 102, a gate of the third transistor 103, a gate of the sixth transistor 106, and a gate of the seventh transistor 107 are electrically connected to a first terminal 110.

In other words, the nonvolatile memory illustrated in FIG. 1A has the following connections. One of the source and the drain of the first transistor 101 is electrically connected to the high power supply potential line. The other of the source and the drain of the first transistor 101 is electrically connected to one of the source and the drain of the second transistor 102. The other of the source and the drain of the second transistor 102 is electrically connected to one of the source and the drain of the third transistor 103. The other of the source and the drain of the third transistor 103 is electrically connected to one of the source and the drain of the fourth transistor 104. The other of the source and the drain of the fourth transistor 104 is electrically connected to the low power supply potential line. One of the source and the drain of the fifth transistor 105 is electrically connected to the high power supply potential line. The other of the source and the drain of the fifth transistor 105 is electrically connected to one of the source and the drain of the sixth transistor 106. The other of the source and the drain of the sixth transistor 106 is electrically connected to one of the source and the drain of the seventh transistor 107. The other of the source and the drain of the seventh transistor 107 is electrically connected to one of the source and the drain of the eighth transistor 108. The other of the source and the drain of the eighth transistor 108 is electrically connected to the low power supply potential line. The gate of the first transistor 101 and the gate of the fourth transistor 104 are electrically connected to the third terminal 130. The third terminal 130 is electrically connected between the sixth transistor 106 and the seventh transistor 107. The gate of the fifth transistor 105 and the gate of the eighth transistor 108 are electrically connected to the second terminal 120. The second terminal 120 is electrically connected between the second transistor 102 and the third transistor 103. The gate of the second transistor 102, the gate of the third transistor 103, the gate of the sixth transistor 106, and the gate of the seventh transistor 107 are electrically connected to the first terminal 110.

The first transistor 101 and the fifth transistor 105 are each a p-channel transistor, and the fourth transistor 104 and the eighth transistor 108 are each an n-channel transistor. The second transistor 102, the third transistor 103, the sixth transistor 106, and the seventh transistor 107 are each an n-channel transistor in which a channel formation region is formed using an oxide semiconductor layer.

In the drawings, the high power supply potential line is denoted by Vdd and the low power supply potential line is denoted by Vss (this also applies to the description below). It is preferable that the potential of the high power supply potential line be the highest potential supplied from a power supply, and the potential of the low power supply potential line be a ground potential.

Next, operation of the nonvolatile memory having the configuration illustrated in FIG. 1A is described. In the nonvolatile memory having the configuration illustrated in FIG. 1A, a low potential is supplied to the second terminal 120, so that the fifth transistor 105 is turned on and the eighth transistor 108 is turned off. At this time, a high potential is supplied to the first terminal 110, so that the sixth transistor 106 and the seventh transistor 107 are turned on. Thus, the third terminal 130 is electrically connected to the high power supply potential line Vdd via the fifth transistor 105 and the sixth transistor 106 and thus has a high potential.

Since the third terminal 130 has a high potential, the first transistor 101 is turned off and the fourth transistor 104 is turned on. At this time, the first terminal 110 has a high potential as described above; therefore, the second transistor 102 and the third transistor 103 are turned on. Accordingly, the second terminal 120 is electrically connected to the low power supply potential line Vss via the third transistor 103 and the fourth transistor 104 and thus maintains a low potential.

After that, a low potential is supplied to the first terminal 110, so that the second terminal 120 and the third terminal 130 are in an electrically floating state. The second transistor 102, the third transistor 103, the sixth transistor 106, and the seventh transistor 107 are each a transistor in which a channel formation region is formed using an oxide semiconductor layer and has a small off-state current; therefore, electric charges of the second terminal 120 and the third terminal 130 are held. Accordingly, even when the nonvolatile memory is powered off and the high power supply potential line has a low potential (e.g., Vss), the potentials of the second terminal 120 and the third terminal 130 are held. Consequently, when the nonvolatile memory is powered on again and a high potential is supplied to the first terminal 110, the operation can be started again before the state where the high power supply potential line has a low potential (the nonvolatile memory is powered off).

As described above, when the nonvolatile memory illustrated in FIG. 1A is powered off, the first terminal 110 has a low potential, whereby the second transistor 102, the third transistor 103, the sixth transistor 106, and the seventh transistor 107 are turned off. Since the second transistor 102, the third transistor 103, the sixth transistor 106, and the seventh transistor 107 are each a transistor in which a channel formation region is formed using an oxide semiconductor layer, a region serving as an electric charge holding portion (denoted by a heavy line in FIG. 1A) can hold electric charge. Accordingly, even when the nonvolatile memory is temporarily powered off, the nonvolatile memory can operate correctly because electric charge is held in the electric charge holding portion. In addition, stored data can be held even when power is not supplied to the power supply potential line (even when the nonvolatile memory is powered off) at a time other than writing and reading operations, so that power consumption can be reduced.

Figure 1B:
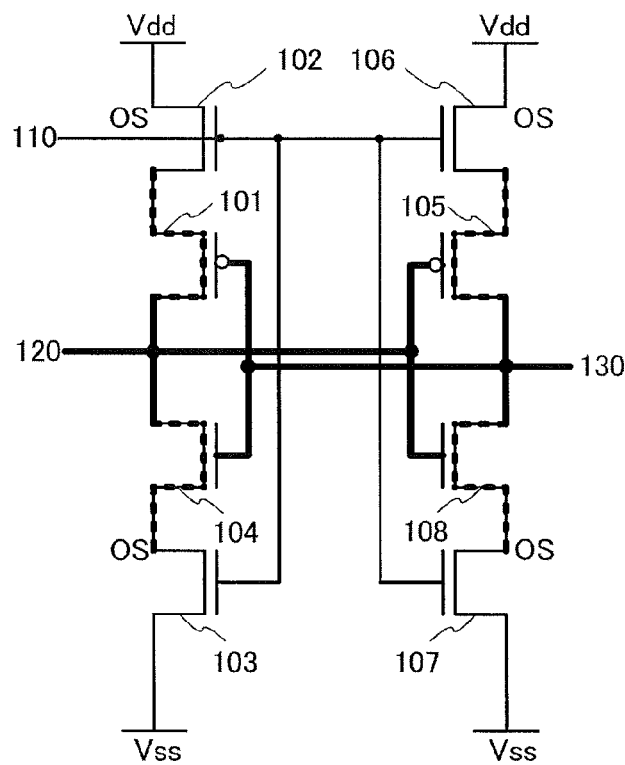

The configuration of the nonvolatile memory illustrated in FIG. 1A is one example, and the configuration of the nonvolatile memory of the present invention is not limited thereto. FIG. 1B illustrates an example of a configuration of a nonvolatile memory according to an embodiment of the present invention which is different from that in FIG. 1A.

FIG. 1B illustrates an example of a configuration of a nonvolatile memory according to an embodiment of the present invention. In order to obtain the nonvolatile memory illustrated in FIG. 1B, the configuration in FIG. 1A is changed as follows. The first transistor 101 and the second transistor 102 are replaced with each other, the third transistor 103 and the fourth transistor 104 are replaced with each other, the fifth transistor 105 and the sixth transistor 106 are replaced with each other, and the seventh transistor 107 and the eighth transistor 108 are replaced with each other. Connections of gates of these transistors are the same as those in the nonvolatile memory in FIG. 1A.

The first transistor 101 and the fifth transistor 105 are each a p-channel transistor, and the fourth transistor 104 and the eighth transistor 108 are each an n-channel transistor. The second transistor 102, the third transistor 103, the sixth transistor 106, and the seventh transistor 107 are each an n-channel transistor in which a channel formation region is formed using an oxide semiconductor layer.

When the nonvolatile memory illustrated in FIG. 1B is powered off (when a low potential is supplied to the high power supply potential line Vdd), the first terminal 110 has a low potential, whereby the second transistor 102, the third transistor 103, the sixth transistor 106, and the seventh transistor 107 are turned off. Since the second transistor 102, the third transistor 103, the sixth transistor 106, and the seventh transistor 107 are each a transistor in which a channel formation region is formed using an oxide semiconductor layer and thus has a small off-state current, a region serving as an electric charge holding portion (denoted by a heavy line in FIG. 1B (part of electric charge is also held in a region denoted by a heavy dashed line)) can hold electric charge. Accordingly, even when the nonvolatile memory is temporarily powered off, the nonvolatile memory can operate correctly because electric charge is held in the electric charge holding portion. In addition, stored data can be held even when power is not supplied to the power supply potential line (even when the nonvolatile memory is powered off) at a time other than writing and reading operations, so that power consumption can be reduced.

Figure 2:
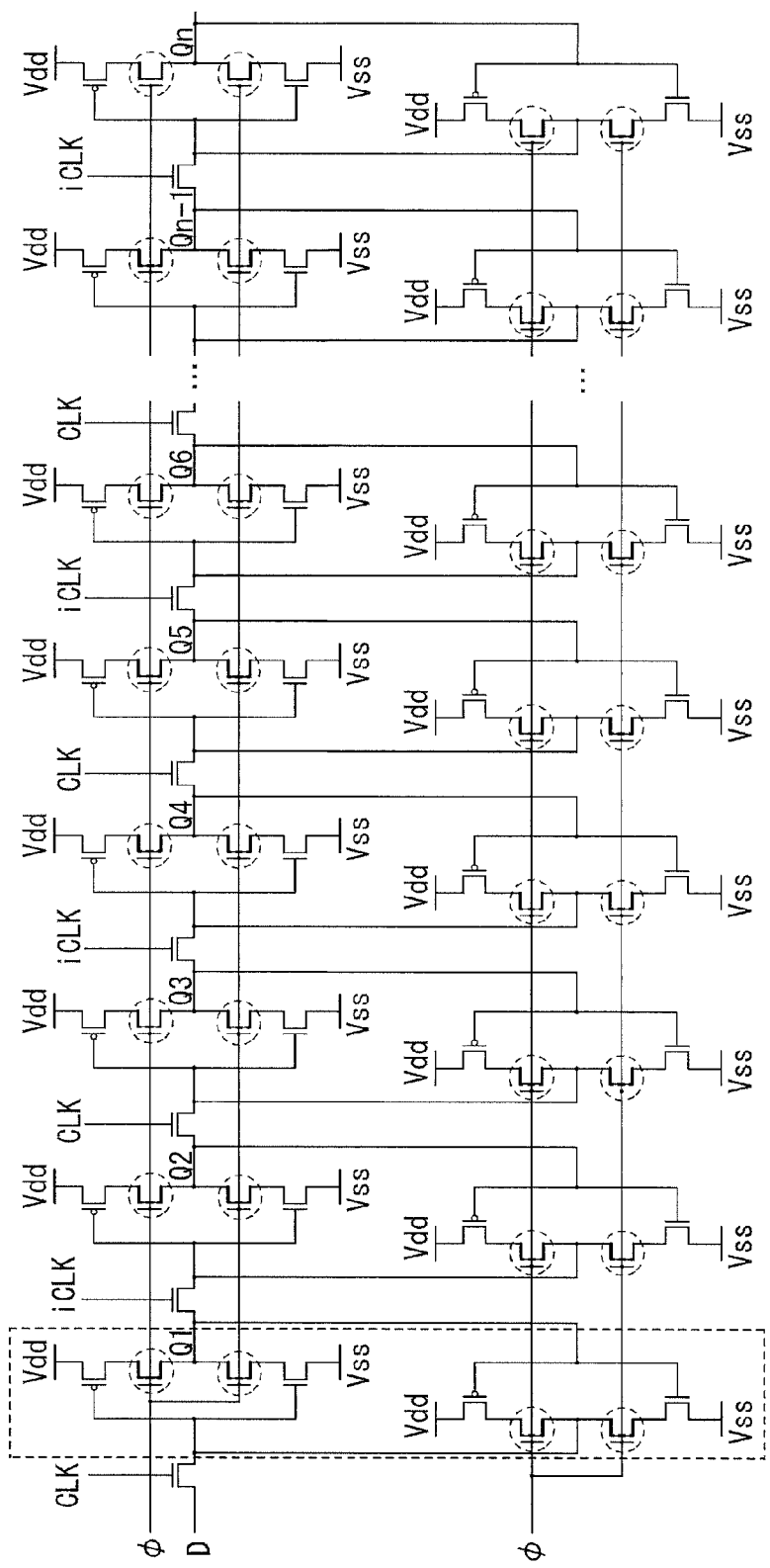
FIG. 2 is a circuit diagram of a shift register to which the nonvolatile memory in FIG. 1A is applied.
Figure 3:
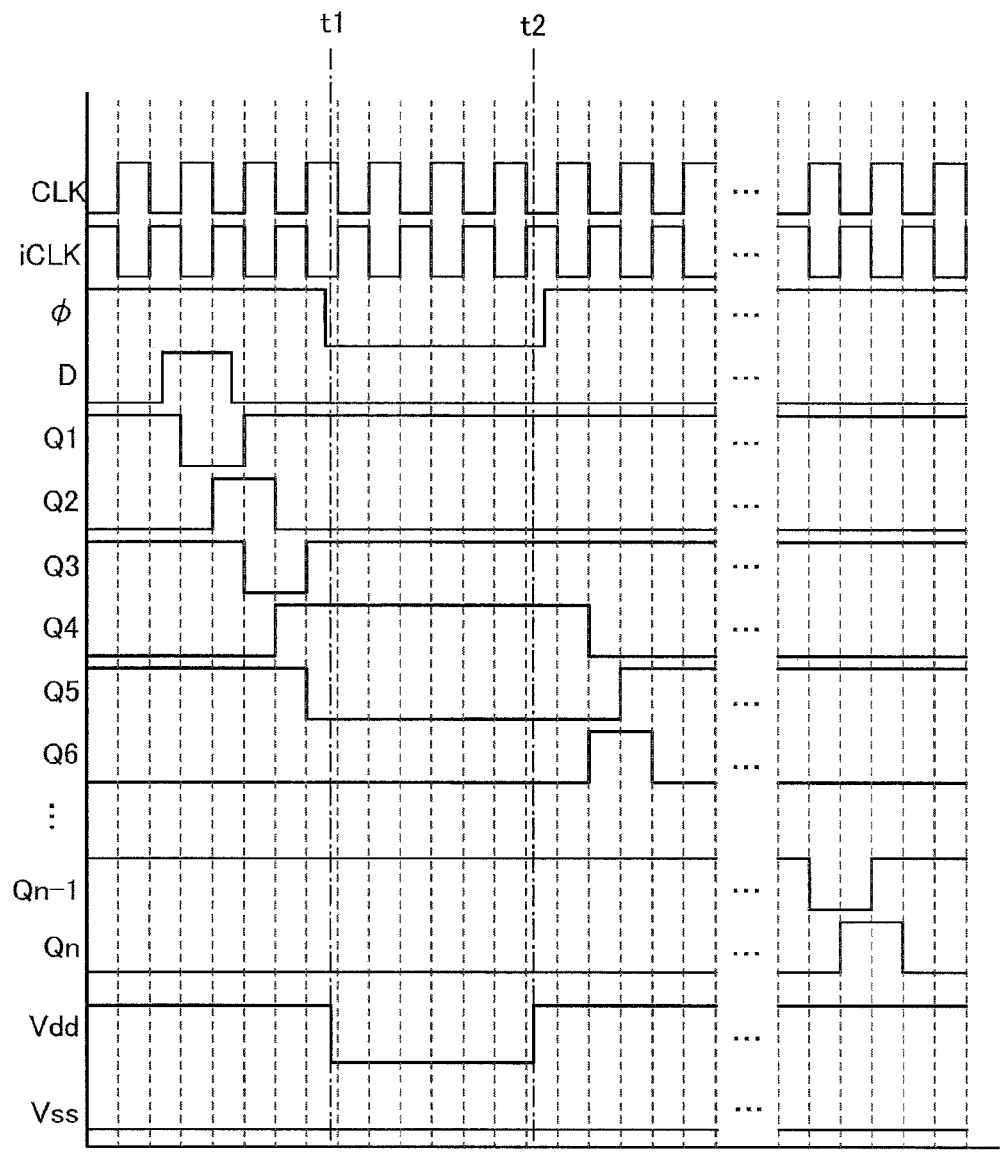
FIG. 3 is a diagram illustrating operation of the shift register in FIG. 2.

The nonvolatile memories illustrated in FIGS. 1A and 1B can be applied to a shift register. FIG. 2 illustrates a circuit configuration of a shift register including the plurality of nonvolatile memories illustrated in FIG. 1A. A rectangular region denoted by a dashed line corresponds to the nonvolatile memory illustrated in FIG. 1A. FIG. 3 is a timing chart showing operation of the shift register in FIG. 2.

It is also possible to form a shift register by providing the plurality of nonvolatile memories illustrated in FIG. 1B.

In FIG. 2, CLK denotes a line to which a clock signal is input, iCLK denotes a line to which an inversion signal of the clock signal is input, and D denotes a data input signal line.

It is preferable in FIG. 2 that each of the transistors surrounded by dashed circles be a transistor in which a channel formation region is formed using an oxide semiconductor layer. A transistor in which the clock signal CLK is input to a gate and a transistor in which the inversion signal iCLK of the clock signal is input to a gate are each preferably a transistor in which a channel formation region is formed using an oxide semiconductor layer.

In FIG. 3, when the nonvolatile memory is powered off at a time t1, the high power supply potential line Vdd has a low potential, and the potential is held even when the nonvolatile memory is powered off. As shown in FIG. 3, a low potential is supplied to a control signal line ϕ immediately before the time t1. Then, a low potential is also supplied to the high power supply potential line Vdd, and the potentials are held even when the nonvolatile memory is powered off. Thus, by supplying a high potential to the high power supply potential line Vdd immediately after a time t2 and then supplying a high potential to the control signal line ϕ, the operation can be started again before the state where the nonvolatile memory is powered off.

The configuration of the nonvolatile memory according to an embodiment of the present invention is not limited to the configurations illustrated in FIGS. 1A and 1B. For example, in the configuration in FIG. 1A, the third transistor 103 may also serve as the fourth transistor 104.

Figure 4A:
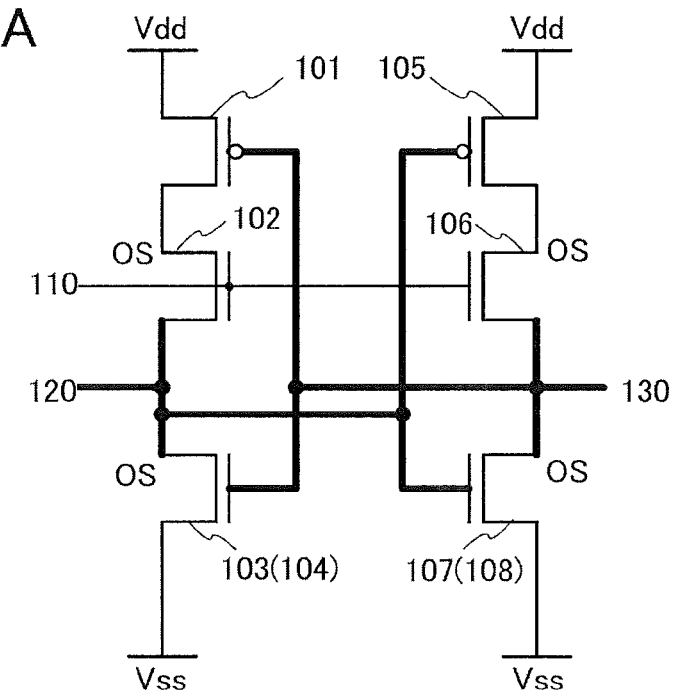
FIGS. 4A and 4B are circuit diagrams each illustrating an example of a nonvolatile memory according to an embodiment of the present invention.

FIG. 4A illustrates an example of a configuration of a nonvolatile memory according to an embodiment of the present invention. The nonvolatile memory illustrated in FIG. 4A has the following connections. One of a source and a drain of a first transistor 101 is electrically connected to a high power supply potential line. The other of the source and the drain of the first transistor 101 is electrically connected to one of a source and a drain of a second transistor 102. The other of the source and the drain of the second transistor 102 is electrically connected to one of a source and a drain of a third transistor 103. The other of the source and the drain of the third transistor 103 is electrically connected to a low power supply potential line. One of a source and a drain of a fifth transistor 105 is electrically connected to the high power supply potential line. The other of the source and the drain of the fifth transistor 105 is electrically connected to one of a source and a drain of a sixth transistor 106. The other of the source and the drain of the sixth transistor 106 is electrically connected to one of a source and a drain of a seventh transistor 107. The other of the source and the drain of the seventh transistor 107 is electrically connected to the low power supply potential line. A gate of the first transistor 101 and a gate of the third transistor 103 are electrically connected to a third terminal 130. The third terminal 130 is electrically connected between the other of the source and the drain of the sixth transistor 106 and one of the source and the drain of the seventh transistor 107. A gate of the fifth transistor 105 and a gate of the seventh transistor 107 are electrically connected to a second terminal 120. The second terminal 120 is electrically connected between the other of the source and the drain of the second transistor 102 and one of the source and the drain of the third transistor 103. A gate of the second transistor 102 and a gate of the sixth transistor 106 are electrically connected to a first terminal 110.

The first transistor 101 and the fifth transistor 105 are each a p-channel transistor. The second transistor 102, the third transistor 103, the sixth transistor 106, and the seventh transistor 107 are each an n-channel transistor in which a channel formation region is formed using an oxide semiconductor layer.

Figure 4B:
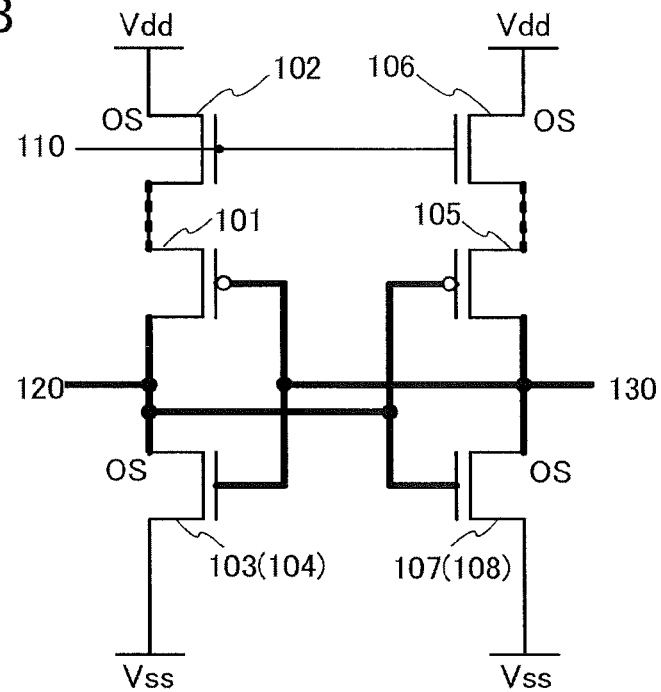

Instead of the configuration in FIG. 4A, a configuration in FIG. 4B may be employed. A nonvolatile memory illustrated in FIG. 4B has the following connections. One of a source and a drain of a second transistor 102 is electrically connected to a high power supply potential line. The other of the source and the drain of the second transistor 102 is electrically connected to one of a source and a drain of a first transistor 101. The other of the source and the drain of the first transistor 101 is electrically connected to one of a source and a drain of a third transistor 103. The other of the source and the drain of the third transistor 103 is electrically connected to a low power supply potential line. One of a source and a drain of a sixth transistor 106 is electrically connected to the high power supply potential line. The other of the source and the drain of the sixth transistor 106 is electrically connected to one of a source and a drain of a fifth transistor 105. The other of the source and the drain of the fifth transistor 105 is electrically connected to one of a source and a drain of a seventh transistor 107. The other of the source and the drain of the seventh transistor 107 is electrically connected to the low power supply potential line. A gate of the first transistor 101 and a gate of the third transistor 103 are electrically connected to a third terminal 130. The third terminal 130 is electrically connected between the other of the source and the drain of the fifth transistor 105 and one of the source and the drain of the seventh transistor 107. A gate of the fifth transistor 105 and a gate of the seventh transistor 107 are electrically connected to a second terminal 120. The second terminal 120 is electrically connected between the other of the source and the drain of the first transistor 101 and one of the source and the drain of the third transistor 103. A gate of the second transistor 102 and a gate of the sixth transistor 106 are electrically connected to a first terminal 110.

The configurations in FIGS. 4A and 4B are preferable to the configurations in FIGS. 1A and 1B because the number of the elements can be smaller.

Figure 5:
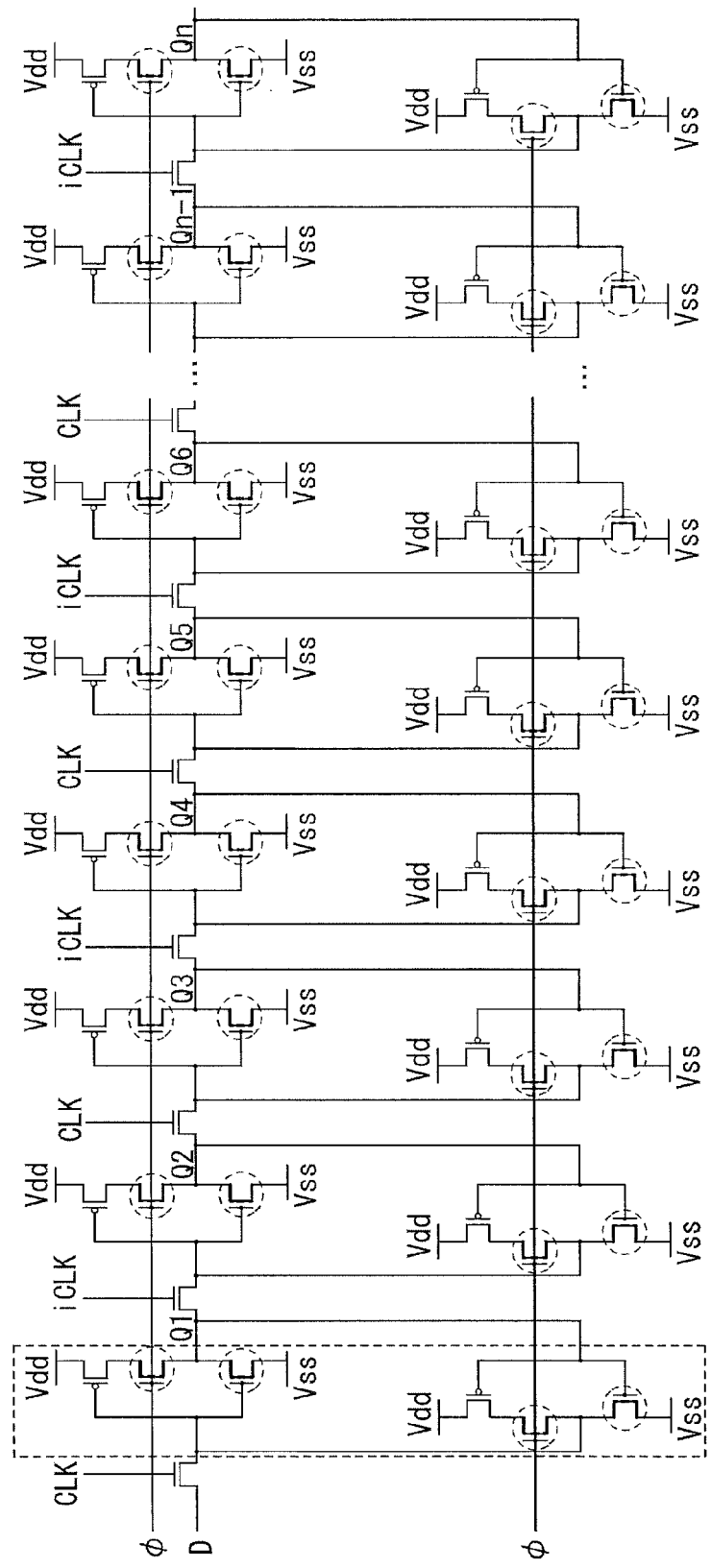
FIG. 5 is a circuit diagram of a shift register to which the nonvolatile memory in FIG. 4A is applied.

The nonvolatile memories illustrated in FIGS. 4A and 4B can be applied to a shift register. FIG. 5 illustrates a circuit configuration of a shift register including the plurality of nonvolatile memories illustrated in FIG. 4A. A rectangular region denoted by a dashed line corresponds to the nonvolatile memory illustrated in FIG. 4A. The operation of the shift register in FIG. 5 is the same as that in FIG. 2; thus, the description thereof is omitted here. It is also possible to form a shift register by providing the plurality of nonvolatile memories illustrated in FIG. 4B.

It is also preferable in FIG. 5 that each of the transistors surrounded by dashed circles be a transistor in which a channel formation region is formed using an oxide semiconductor layer. Both a transistor in which a clock signal CLK is input to a gate and a transistor in which an inversion signal iCLK of the clock signal is input to a gate may each preferably be a transistor in which a channel formation region is formed using an oxide semiconductor layer.

The nonvolatile memory according to an embodiment of the present invention has been described above. Note that the p-channel transistor and the n-channel transistor in the nonvolatile memory are not limited to particular transistors, and a variety of transistors can be used. Thus, the p-channel transistor and the n-channel transistor may each be a transistor formed using polycrystalline silicon or a transistor formed using a silicon on insulator (SOI) substrate.

Next, a transistor which can be used for the nonvolatile memory will be described. As the transistor in which a channel formation region is formed using an oxide semiconductor layer, a transistor including a metal oxide having semiconductor characteristics can be used. As a transistor other than the transistor in which a channel formation region is formed using an oxide semiconductor layer, a transistor formed using a semiconductor substrate can be used.

Figure 6:
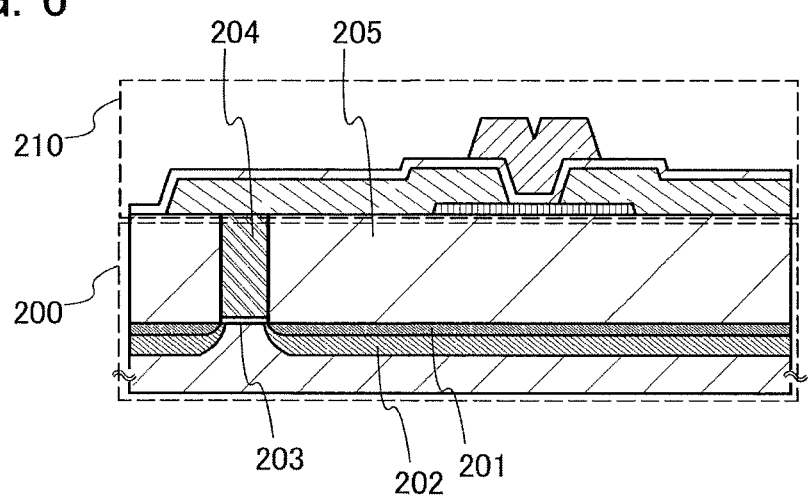
FIG. 6 is a cross-sectional schematic view of an applicable transistor.

FIG. 6 schematically illustrates examples of cross-sectional structures of transistors which can be used for the nonvolatile memory. In the nonvolatile memory illustrated in FIG. 6, a transistor in which a channel formation region is formed using an oxide semiconductor layer is formed over a transistor formed using a semiconductor substrate. The transistor formed using a semiconductor substrate can be a p-channel transistor or an n-channel transistor.

For example, the first transistor 101 and the fifth transistor 105 in FIG. 1A may each be the p-channel transistor formed using a semiconductor substrate. For example, the fourth transistor 104 and the eighth transistor 108 in FIG. 1A may each be the n-channel transistor formed using a semiconductor substrate. For example, the second transistor 102, the third transistor 103, the sixth transistor 106, and the seventh transistor 107 in FIG. 1A may each be the transistor in which a channel formation region is formed using an oxide semiconductor layer.

The p-channel transistor and the n-channel transistor formed using a semiconductor substrate may be formed by a known method. After the p-channel transistor and/or the n-channel transistor formed using a semiconductor substrate is formed, the transistor in which a channel formation region is formed using an oxide semiconductor layer is formed thereover. That is, by using a semiconductor substrate 200 provided with the p-channel transistor and/or the n-channel transistor as a substrate, the transistor in which a channel formation region is formed using an oxide semiconductor layer is formed over the semiconductor substrate 200.

The semiconductor substrate 200 provided with the p-channel transistor and/or the re-channel transistor includes high-concentration impurity regions 201 serving as a source region and a drain region, low-concentration impurity regions 202, a gate insulating film 203, a gate electrode 204, and an interlayer insulating film 205 (FIG. 6).

Figure 7A:
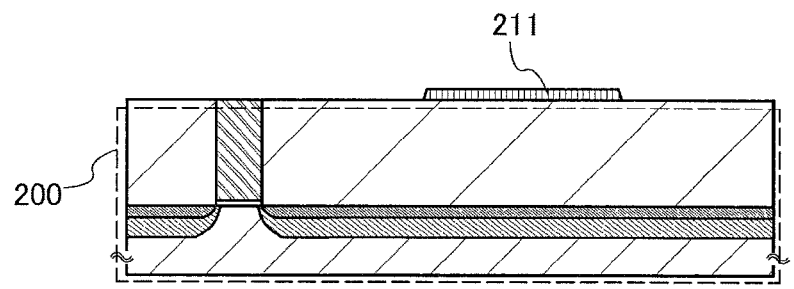
FIGS. 7A to 7D illustrate a method for manufacturing the transistor in FIG. 6.
Figure 7B:
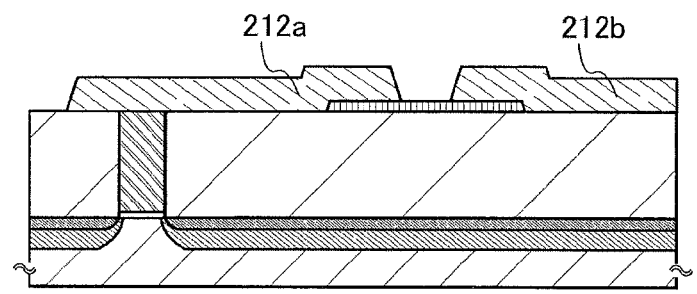
Figure 7C:
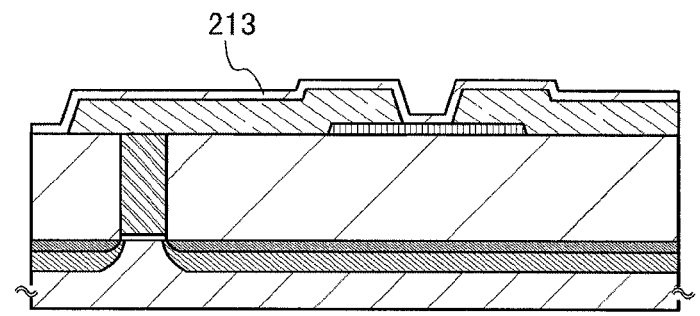
Figure 7D:
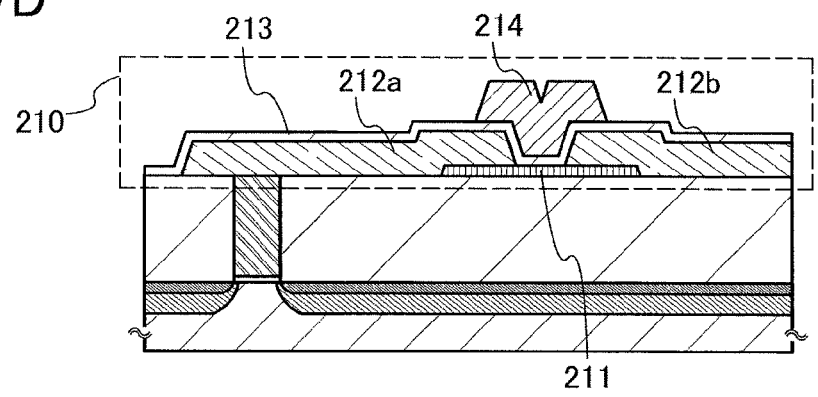

A transistor 210 in which a channel formation region is formed using an oxide semiconductor layer includes an oxide semiconductor layer 211 over the semiconductor substrate 200 provided with the p-channel transistor and/or the n-channel transistor, a source electrode 212a and a drain electrode 212b which are separated from each other and in contact with the oxide semiconductor layer 211, a gate insulating film 213 over at least a channel formation region of the oxide semiconductor layer 211, and a gate electrode 214 overlapping with the oxide semiconductor layer 211 over the gate insulating film 213 (FIG. 7D).

The interlayer insulating film 205 also serves as a base insulating film of the oxide semiconductor layer 211.

The interlayer insulating film 205 contains oxygen at least in its surface and is formed using an insulating oxide from which part of oxygen is released by heat treatment. As an insulating oxide from which part of oxygen is released by heat treatment, a material containing more oxygen than that in the stoichiometric proportion is preferably used. This is because oxygen can be diffused to the oxide semiconductor film in contact with the interlayer insulating film 205 by the heat treatment.

As an insulating oxide containing more oxygen than that in the stoichiometric proportion, silicon oxide represented by $SiO_x$ where $x>2$ can be given, for example. However, an embodiment of the present invention is not limited thereto, and the interlayer insulating film 205 may be formed using silicon oxynitride, silicon nitride oxide, aluminum oxide, aluminum oxynitride, gallium oxide, hafnium oxide, yttrium oxide, or the like.

The interlayer insulating film 205 may be a stack of a plurality of films The interlayer insulating film 205 may have a stacked-layer structure in which a silicon oxide film is formed over a silicon nitride film, for example.

In an insulating oxide which contains more oxygen than that in the stoichiometric proportion, part of oxygen is easily released by heat treatment. The amount of released oxygen (the value converted into that of oxygen atoms) obtained by TDS analysis when part of oxygen is easily released by heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

Here, how to perform TDS analysis is described. The release amount of a gas in the TDS analysis is proportional to a time integral value of the ion intensity. Thus, from the time integral value of the ion intensity of an oxide and a reference value of a standard sample, the release amount of the gas can be calculated. The reference value of a standard sample refers to the ratio of the density of a predetermined atom contained in a sample (standard sample) to the time integral value of the ion intensity.

For example, by using the ion intensity of a silicon wafer containing a predetermined density of hydrogen (standard sample) and the ion intensity of an oxide, the release amount ($N_{O2}$) of oxygen molecules ($O_2$) from the oxide can be obtained by the formula: $N_{O2}=N_{H2}/S_{H2} \times S_{O2} \times \alpha$.

$N_{H2}$ is a value obtained by conversion of hydrogen molecules ($H_2$) released from the standard sample into density. $S_{H2}$ is the time integral value of the ion intensity of hydrogen molecules ($H_2$) of the standard sample. In other words, the reference value of the standard sample is $N_{H2}/SH_2$. $SO_2$ is the time integral value of the ion intensity of oxygen molecules ($O_2$) of the oxide. $\alpha$ is a coefficient which influences the ion intensity. Refer to Japanese Published Patent Application No. H6-275697 for details of the formula.

Note that the release amount of oxygen obtained by TDS analysis (the value converted into that of oxygen atoms) is measured with the use of a silicon wafer containing hydrogen atoms at $1\times10^{16}$ atoms/cm$^3$ as the standard sample, by using a thermal desorption spectrometer, EMD-WA1000S/W manufactured by ESCO, Ltd.

Note that in the TDS analysis, oxygen is partly detected as an oxygen atom. The ratio between oxygen molecules and oxygen atoms can be calculated from the ionization rate of the oxygen molecules. Note that, since the coefficient $\alpha$ includes the ionization rate of the oxygen molecules, the amount of the released oxygen atoms can also be calculated through the evaluation of the amount of the released oxygen molecules.

In addition, $N_{O2}$ is the amount of released oxygen molecules ($O_2$). Thus, the amount of released oxygen converted into oxygen atoms is twice the amount of released oxygen molecules ($O_2$).

The interlayer insulating film 205 may be formed by a sputtering method, a CVD method, or the like, and is preferably formed by a sputtering method. In the case where a silicon oxide film is formed as the interlayer insulating film 205, a quartz (preferably, synthesized quartz) target may be used as a target, and an argon gas may be used as a sputtering gas. Alternatively, a silicon target and a gas containing oxygen may be used as a target and a sputtering gas, respectively. As a gas containing oxygen, a mixed gas of an argon gas and an oxygen gas may be used or only an oxygen gas may be used.

After the interlayer insulating film 205 is formed, first heat treatment is performed before the oxide semiconductor film to be the oxide semiconductor layer 211 is formed. The first heat treatment is performed in order to remove water and hydrogen contained in the interlayer insulating film 205. The temperature of the first heat treatment may be higher than or equal to 400° C. and lower than a temperature at which the semiconductor substrate 200 provided with the p-channel transistor and/or the n-channel transistor is changed in quality or shape, preferably higher than or equal to 400° C. and lower than or equal to 750° C., that is, lower than the temperature of second heat treatment performed later.

Then, the second heat treatment is performed after the oxide semiconductor film is formed. Through the second heat treatment, oxygen is supplied from the interlayer insulating film 205 to the oxide semiconductor film. The timing of the second heat treatment is not limited to this timing, and the second heat treatment may be performed after the oxide semiconductor layer 211 is formed by processing the oxide semiconductor film.

Note that it is preferable that in the second heat treatment, hydrogen, water, a hydroxyl group, hydride, and the like be not contained in a nitrogen gas or a rare gas such as a helium gas, a neon gas, or an argon gas. Alternatively, the purity of a nitrogen gas or a rare gas such as a helium gas, a neon gas, or an argon gas that is introduced into a heat treatment apparatus is preferably higher than or equal to 6N (99.9999%), more preferably higher than or equal to 7N (99.99999%) (that is, the impurity concentration be lower than or equal to 1 ppm, preferably lower than or equal to 0.1 ppm).

Further, the oxide semiconductor film or the oxide semiconductor layer 211 may be crystallized to be a microcrystalline layer or a polycrystalline layer depending on a condition of the second heat treatment or a material of the oxide semiconductor film or the oxide semiconductor layer 211. For example, the oxide semiconductor film or the oxide semiconductor layer 211 may become a microcrystalline oxide semiconductor layer having a degree of crystallization of higher than or equal to 90%, or higher than or equal to 80%. Further, depending on the condition of the second heat treatment or the material of the oxide semiconductor film or the oxide semiconductor layer 211, the oxide semiconductor film or the oxide semiconductor layer 211 may become an amorphous oxide semiconductor layer containing no crystalline component. The oxide semiconductor film or the oxide semiconductor layer 211 may also become an oxide semiconductor layer in which a microcrystalline part (with a grain diameter of 1 nm to 20 nm, typically 2 nm to 4 nm) is mixed in an amorphous oxide semiconductor layer.

In the second heat treatment, the interlayer insulating film 205 serves as an oxygen supply source. The interlayer insulating film 205 is preferably a stack of a layer serving as an oxygen supply source and a layer protecting the layer serving as an oxygen supply source so that oxygen is not released in the first heat treatment. The layer serving as an oxygen supply source is preferably formed using silicon oxide, and the layer protecting the layer serving as an oxygen supply source is preferably formed using aluminum oxide.

It is preferable that the average surface roughness ($R_a$) of the interlayer insulating film 205 over which the oxide semiconductor film is formed be greater than or equal to 0.1 nm and less than 0.5 nm. This is because crystal orientations can be aligned when the oxide semiconductor film is a crystalline film.

Note that here, the average surface roughness ($R_a$) is obtained by expanding the center line average roughness ($R_a$) which is defined by JISB0601:2001 (ISO 4287:1997) into three dimensions so that $R_a$ can be applied to a measurement surface. The average surface roughness ($R_a$) is an average value of the absolute values of deviations from the reference surface to the specific surface.

Here, the center line average roughness ($R_a$) is shown by the following formula (1) assuming that a portion having a measurement length L is picked up from a roughness curve in the direction of the center line, the direction of the center line of the roughness curve of the picked portion is represented by an X-axis, the direction of longitudinal magnification (direction perpendicular to the X-axis) is represented by a Y-axis, and the roughness curve is expressed as Y=F(X).

$$R_a = \frac{1}{L} \int_0^L |F(X)| dX \quad (1)$$

When the measurement surface which is a surface represented by measurement data is expressed as Z=F(X,Y), the average surface roughness ($R_a$) is an average value of the absolute values of deviations from the reference surface to the specific surface and is shown by the following formula (2).

$$R_a = \frac{1}{S_0} \int_{Y_1}^{Y_2} \int_{X_1}^{X_2} |F(X, Y) - Z_0| dX dY \quad (2)$$

Here, the specific surface is a surface which is a target of roughness measurement, and is a rectangular region which is surrounded by four points represented by the coordinates $(X_1,Y_1)$, $(X_1,Y_2)$, $(X_2,Y_1)$, and $(X_2,Y_2)$. $S_0$ represents the area of the specific surface when the specific surface is flat ideally.

In addition, the reference surface refers to a surface parallel to an X-Y surface at the average height of the specific surface. In short, when the average value of the height of the specific surface is denoted by $Z_0$, the height of the reference surface is also denoted by $Z_0$.

Chemical mechanical polishing (CMP) treatment may be performed so that the average surface roughness of the interlayer insulating film 205 can be greater than or equal to 0.1 nm and less than 0.5 nm. CMP treatment may be performed before formation of the oxide semiconductor film but is preferably performed before the first heat treatment.

The CMP treatment may be performed at least once. When the CMP treatment is performed plural times, first polishing is preferably performed with a high polishing rate followed by final polishing with a low polishing rate.

Instead of the CMP treatment, dry etching or the like may be performed in order to planarize the interlayer insulating film 205. As an etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like can be used as appropriate.

Instead of the CMP treatment, plasma treatment or the like may be performed in order to planarize the interlayer insulating film 205. A rare gas may be used in the plasma treatment. In the plasma treatment, a surface to be processed is irradiated with ions of an inert gas, and minute projections and depressions on the surface to be processed are planarized by a sputtering effect. Such plasma treatment is also referred to as reverse sputtering.

In order to planarize the interlayer insulating film 205, at least one of the above treatments may be performed. For example, only reverse sputtering may be performed. Alternatively, dry etching may be performed after the CMP treatment is performed. Note that it is preferable that dry etching or reverse sputtering be used so that water can be prevented from entering the interlayer insulating film 205 over which the oxide semiconductor film is formed. In particular, in the case where planarization treatment is performed after the second heat treatment, dry etching or reverse sputtering is preferably used.

The oxide semiconductor layer 211 may be, for example, selectively formed in such a manner that an oxide semiconductor film is formed, an etching mask is formed over the oxide semiconductor film, and etching is performed. Alternatively, an ink-jet method or the like may be used.

The oxide semiconductor film may be formed using the following: a four-component metal oxide such as an In—Sn—Ga—Zn—O-based metal oxide, a three-component metal oxide such as an In—Ga—Zn—O-based metal oxide (also referred to as IGZO), an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, or an In—Ga—O-based metal oxide. Alternatively, a one-component metal oxide such as an In—O-based metal oxide, a Sn—O-based metal oxide, or a Zn—O-based metal oxide may be used. Note that an n-component metal oxide includes n kinds of metals. Here, for example, an In—Ga—Zn—O-based metal oxide means an oxide containing indium (In), gallium (Ga), and zinc (Zn), and there is no particular limitation on the composition ratio thereof. The In—Ga—Zn—O-based metal oxide may contain an element other than In, Ga, and Zn.

Note that it is preferable that oxygen be contained in the metal oxide in excess of the amount in the stoichiometric proportion. When oxygen is contained in excess, generation of carriers due to oxygen vacancies in the oxide semiconductor film which is formed can be suppressed.

Note that for example, in the case where the oxide semiconductor film is formed using an In—Zn—O-based metal oxide, a target has an atomic ratio where In/Zn is 0.5 to 50, preferably 1 to 20, more preferably 1.5 to 15. When the amount of Zn in the atomic ratio is in the above preferred range, the field-effect mobility of the transistor can be improved. Here, when the atomic ratio of the compound is In:Zn:O=X:Y:Z, it is preferable to satisfy the relation of Z>1.5X+Y so that oxygen is contained in excess.

Note that the energy gap of a metal oxide which can be applied to the oxide semiconductor film is preferably greater than or equal to 2 eV, more preferably greater than or equal to 2.5 eV, still more preferably greater than or equal to 3 eV. The off-state current of the transistor can be reduced by using a metal oxide having a wide band gap as described above.

Note that the oxide semiconductor film contains hydrogen. The hydrogen may be contained in the oxide semiconductor film in the form of a hydrogen molecule, water, a hydroxyl group, or other hydride in some cases, in addition to the form of a hydrogen atom. It is preferable that the amount of hydrogen contained in the oxide semiconductor film be as small as possible.

Note that the concentrations of an alkali metal and an alkaline earth metal in the oxide semiconductor film are preferably low, and these concentrations are preferably lower than or equal to $1\times10^{18}$ atoms/cm$^3$, more preferably lower than or equal to $2\times10^{16}$ atoms/cm$^3$. This is because an alkali metal and an alkaline earth metal are bonded to an oxide semiconductor to generate carriers in some cases, in which case the off-state current of the transistor is increased.

Note that there is no particular limitation on the formation method and the thickness of the oxide semiconductor film and they can be determined in consideration of the size or the like of the transistor to be manufactured. As an example of a method for forming the oxide semiconductor film, a sputtering method, a coating method, a printing method, a pulsed laser deposition method, or the like can be given. The thickness of the oxide semiconductor film is preferably greater than or equal to 3 nm and less than or equal to 50 nm.

Here, as a preferable example, the oxide semiconductor film is formed by a sputtering method using an In—Ga—Zn—O-based metal oxide target. A rare gas (for example, an argon gas), an oxygen gas, or a mixed gas of a rare gas and an oxygen gas may be used as a sputtering gas.

It is preferable that a high-purity gas from which hydrogen, water, a hydroxyl group, hydride, and the like is removed be used as a sputtering gas for the formation of the oxide semiconductor film. In order to keep the high purity of a sputtering gas, preferably, a gas attached to the inner wall or the like of a treatment chamber is removed, and the semiconductor substrate 200 provided with the p-channel transistor and/or the n-channel transistor is subjected to heat treatment before the oxide semiconductor film is formed. In addition, a high-purity sputtering gas may be introduced to the treatment chamber. In that case, the purity of an argon gas may be higher than or equal to 9N (99.9999999%), the dew point thereof may be −121° C., the concentration of water may be 0.1 ppb, and the concentration of hydrogen may be 0.5 ppb. The purity of an oxygen gas may be higher than or equal to 8N (99.999999%), the dew point thereof may be −112° C., the concentration of water may be 1 ppb, and the concentration of hydrogen may be 1 ppb. When the oxide semiconductor film is formed while the semiconductor substrate 200 provided with the p-channel transistor and/or the n-channel transistor is kept at high temperature, the concentration of impurities contained in the oxide semiconductor film can be reduced. Here, the semiconductor substrate 200 provided with the p-channel transistor and/or the n-channel transistor may be kept at a temperature of higher than or equal to 100° C. and lower than or equal to 600° C., preferably higher than or equal to 200° C. and lower than or equal to 400° C.

Note that the oxide semiconductor film may have an amorphous structure or a crystalline structure. In the case where the oxide semiconductor film has a crystalline structure, a c-axis aligned crystalline (CAAC) oxide semiconductor film is preferably used. When the oxide semiconductor film is a CAAC oxide semiconductor film, the reliability of the transistor can be increased.

Note that a CAAC oxide semiconductor film means an oxide semiconductor film including a crystal which has c-axis alignment and a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (or the surface, or at the interface) (the crystal rotates around the c-axis).

Note that in a broad sense, a CAAC oxide semiconductor film means an oxide semiconductor film which is non-single-crystal and includes a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis.

The CAAC oxide semiconductor film is not a single crystal, but this does not mean that the CAAC oxide semiconductor film is composed of only an amorphous component. Although the CAAC oxide semiconductor film includes a crystallized portion (crystalline portion), a boundary between one crystalline portion and another crystalline portion is not clear in some cases.

In the case where oxygen is included in the CAAC oxide semiconductor film, nitrogen may be substituted for part of oxygen. The c-axes of individual crystalline portions included in the CAAC oxide semiconductor film may be aligned in one direction (e.g., a direction perpendicular to a surface of a substrate over which the CAAC oxide semiconductor film is formed, or a surface, a film surface, or an interface of the CAAC oxide semiconductor film). Alternatively, normals of the a-b planes of individual crystalline portions included in the CAAC oxide semiconductor film may be aligned in one direction (e.g., a direction perpendicular to the surface of the substrate over which the CAAC oxide semiconductor film is formed, or a surface, a film surface, or an interface of the CAAC oxide semiconductor film).

Note that the CAAC oxide semiconductor film may be a conductor, a semiconductor, or an insulator depending on its composition or the like. Further, the CAAC oxide semiconductor film may transmit or not transmit visible light depending on its composition or the like.

As an example of such a CAAC oxide semiconductor film, there is a material which is formed into a film shape and has a triangular or hexagonal atomic arrangement when observed from the direction perpendicular to a surface of the film, a surface of a substrate, or an interface and in which metal atoms are arranged in a layered manner or metal atoms and oxygen atoms (or nitrogen atoms) are arranged in a layered manner when a cross section of the film is observed.

The crystal structure of such a CAAC oxide semiconductor film will be described in detail. In the description below, in principle, a vertical direction is a c-axis direction and a plane perpendicular to the c-axis direction is an a-b plane in FIGS. 8A to 8C and FIGS. 9A and 9B. In the case where the expressions "an upper half" and "a lower half" are simply used, they refer to an upper half above the a-b plane and a lower half below the a-b plane (an upper half and a lower half with respect to the a-b plane). Furthermore, in FIGS. 8A to 8C, O surrounded by a circle represents a tetracoordianate O atom and O surrounded by a double circle represents a tricoordinate O atom.

Figure 8A:
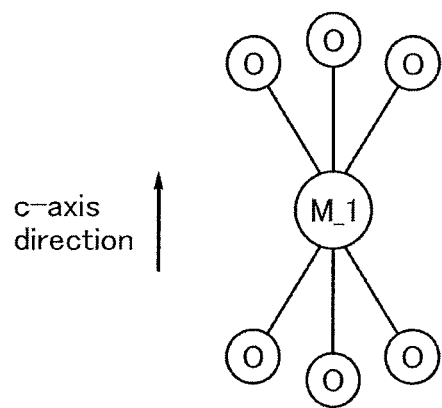
FIGS. 8A to 8C are diagrams each illustrating a crystal structure of an oxide material.

FIG. 8A illustrates a structure having one hexacoordinate metal atom M_1 and six tetracoordinate oxygen (hereinafter tetracoordinate O) atoms proximate to the metal atom M_1. Such a structure in which one metal atom and oxygen atoms proximate to the metal atom are only illustrated is called a subunit here. The structure in FIG. 8A is actually an octahedral structure, but is illustrated as a planar structure for simplicity. Note that three tetracoordinate O atoms exist in each of an upper half and a lower half in FIG. 8A.

Figure 8B:
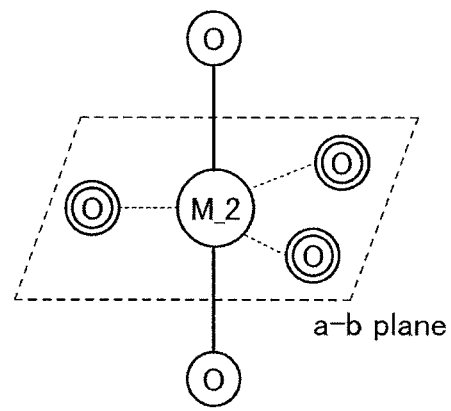

FIG. 8B illustrates a structure having one pentacoordinate metal atom M_2, three tricoordinate oxygen (hereinafter tricoordinate 0) atoms proximate to the metal atom M_2, and two tetrocoordinate O atoms proximate to the metal atom M_2. All the tricoordinate O atoms exist on the a-b plane. One tetracoordinate O atom exists in each of an upper half and a lower half in FIG. 8B.

Figure 8C:
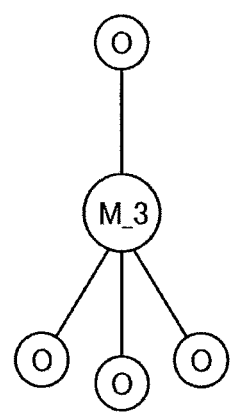

FIG. 8C illustrates a structure having one tetracoordinate metal atom M_3 and four tetracoordinate O atoms proximate to the metal atom M_3. In FIG. 8C, one tetracoordinate O atom exists in an upper half and three tetracoordinate O atoms exist in a lower half.

A metal atom whose coordination number is 4, 5, or 6 is bonded to another metal atom through a tetracoordinate O atom. Specifically, a metal atom is bonded to another metal atom through tetracoordinate O atoms, the number of which is four in total. For example, in the case where the hexacoordinate metal atom M_1 is bonded through three tetracoordinate O atoms in the lower half, it is bonded to the pentacoordinate metal atom M_2 through a teteracoordinate O atom in the upper half of the pentacoordinate metal atom M_2, the pentacoordinate metal atom M_2 through a teteracoordinate O atom in the lower half of the pentacoordinate metal atom M_2, or the tetracoordinate metal atom M_3 through a tetracoordinate O atom in the upper half of the tetracoordinate metal atom M_3.

Besides, subunits are bonded to each other so that the total electric charge in the layered structure is 0 to form a group.

Figure 9A:
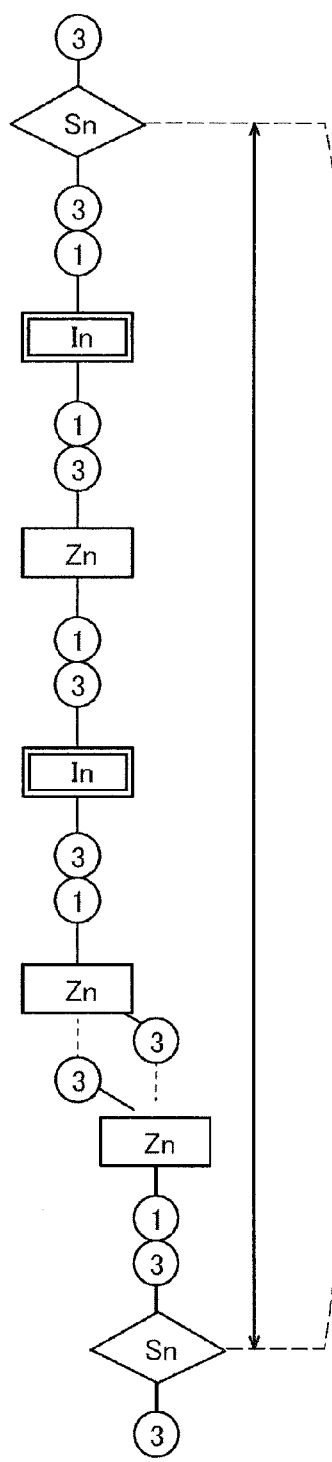
FIGS. 9A to 9C are diagrams illustrating a crystal structure of an oxide material.
Figure 9B:
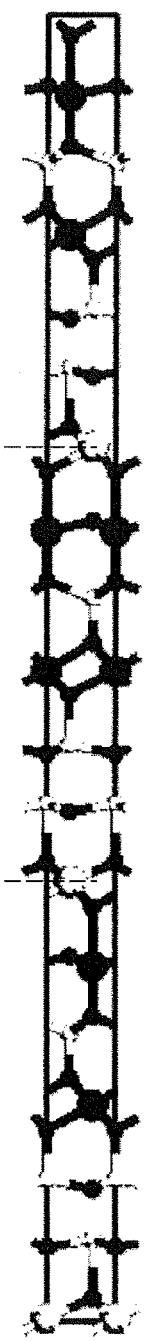
Figure 9C:
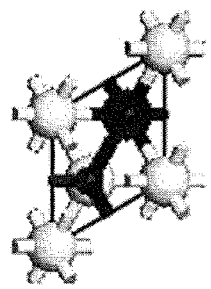

FIG. 9A illustrates a model of a group included in a layered structure of an In—Sn—Zn—O-based material. A structure in which one metal atom and oxygen atoms proximate to the metal atom are only illustrated is called a subunit here. A plurality of subunits form a group. A plurality of groups form one cycle as illustrated in FIG. 9B which is called a unit. Note that FIG. 9C illustrates an atomic arrangement in the case where the layered structure in FIG. 9B is observed from the direction perpendicular to the film surface, substrate surface, or interface.

In FIG. 9A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 9A, one tetracoordinate O atom existing in each of an upper half and a lower half with respect to an In atom is denoted by circled 1. FIG. 9A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the group included in the layered structure of an In—Sn—Zn—O-based material in FIG. 9A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded through one tetracoordinate O atom in its lower half to an In atom proximate to three tetracoordinate O atoms in each of an upper half and a lower half, the In atom is bonded to a Zn atom proximate to one tetracoordinate O atom in an upper half, the Zn atom is bonded through three tetracoordinate O atoms in its lower half to a Zn atom, and the Zn atom is bonded through one tetracoordinate O atom in its lower half to a Sn atom. A plurality of such groups are bonded to form one unit that corresponds to one cycle.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Thus, electric charge of a subunit including Sn is +1. Accordingly, electric charge of −1, which cancels electric charge of +1, is needed to form a layered structure including a Sn atom. As a structure having electric charge of −1, a structure in which two subunits including Zn atoms are bonded as shown in FIG. 9A can be given. For example, when one subunit including a Sn atom is combined with one structure in which two subunits including Zn atoms are bonded, electric charge is canceled, whereby the total electric charge in the layered structure can be 0.

In addition, an In atom can have either five ligands or six ligands. When a structure in which one cycle illustrated in FIG. 9B is repeated is formed, In—Sn—Zn—O-based crystal ($In_2SnZn_3O_8$) can be obtained. Note that a layered structure of the obtained In—Sn—Zn—O-based material can be expressed as a composition formula, $In_2SnZn_2O_7(ZnO)_m$ (m is 0 or a natural number).

The above description also applies to the case of using the four-component metal oxide, the three-component metal oxide, the two-component metal oxide, or the one-component metal oxide described above.

Figure 10A:
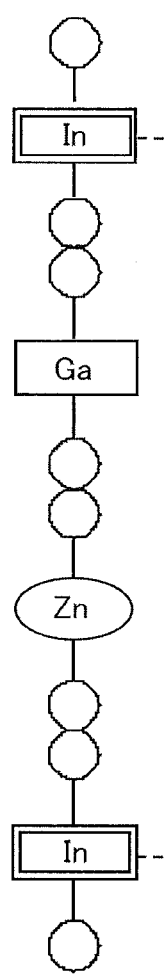
FIGS. 10A to 10C are diagrams illustrating a crystal structure of an oxide material.

FIG. 10A illustrates an example of a model of a first group included in a layered structure of an In—Ga—Zn—O-based material.

In the first group included in the layered structure of the In—Ga—Zn—O-based material in FIG. 10A, in the order starting from the top, an In atom proximate to three tetracoordinate O atoms in each of an upper half and a lower half is bonded to a Zn atom proximate to one tetracoordinate O atom in each of an upper half and a lower half, the Zn atom is bonded to a Ga atom proximate to three tetracoordinate O atoms in an upper half, the Ga atom is bonded through one tetracoordinate O atom in its lower half to an In atom proximate to three tetracoordinate O atoms in each of an upper half and a lower half. A plurality of first groups, three first groups here, are bonded to form one unit that corresponds to one cycle.

Figure 10B:
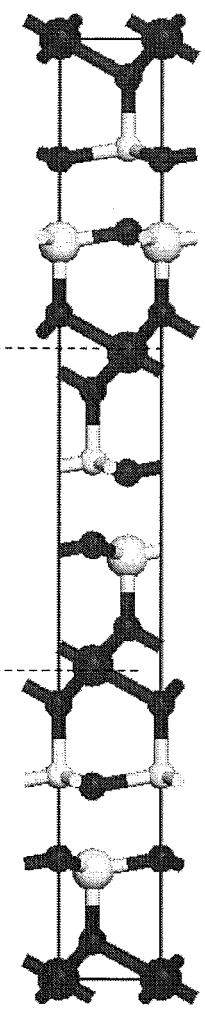
Figure 10C:
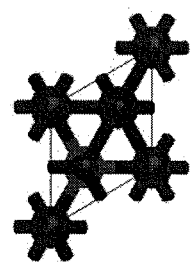

FIG. 10B illustrates a structure of one cycle including the plurality of first groups. Note that FIG. 10C illustrates an atomic arrangement in the case where the layered structure in FIG. 10B is observed from the direction perpendicular to the film surface, substrate surface, or interface.

Figure 11A:
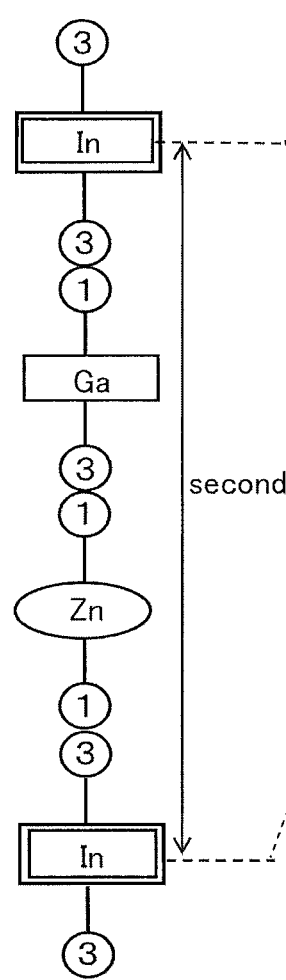
FIGS. 11A to 11C are diagrams illustrating a crystal structure of an oxide material.
Figure 11B:
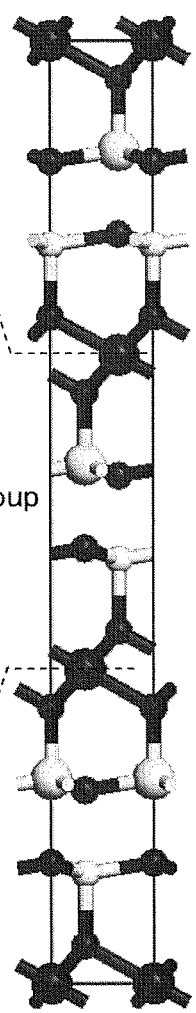
Figure 11C:
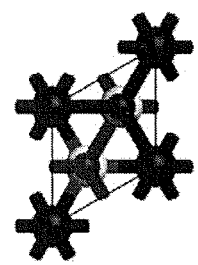

The group included in the layered structure of the In—Ga—Zn—O-based material is not limited to the first group illustrated in FIG. 10A and a combination of other subunits may be employed. For example, FIG. 11A illustrates a second group included in another layered structure of an In—Ga—Zn—O-based material and FIG. 11B illustrates a structure including a plurality of second groups that corresponds to one cycle. Note that FIG. 11C illustrates an atomic arrangement in the case where the layered structure in FIG. 11B is observed from the direction perpendicular to the film surface, substrate surface, or interface.

FIG. 11A illustrates a model of the second group as another example of the layered structure of the In—Ga—Zn—O-based material.

In the second group included in the layered structure of the In—Ga—Zn—O-based material in FIG. 11A, in the order starting from the top, an In atom proximate to three tetracoordinate O atoms in each of an upper half and a lower half is bonded to a Ga atom proximate to one tetracoordinate O atom in an upper half, the Ga atom is bonded through three tetracoordinate O atoms its lower half to a Zn atom proximate to one tetracoordinate O atom in each of an upper half and a lower half, and the Zn atom is bonded through one tetracoordinate O atom in its lower half to an In atom proximate to three tetracoordinate O atoms in each of an upper half and a lower half. A plurality of second groups, three second groups here, are bonded to form one unit that corresponds to one cycle.

Electric charge of a (hexacoordinate or pentacoordinate) In atom, electric charge of a (tetracoordinate) Zn atom, and electric charge of a (pentacoordinate) Ga atom are +3, +2, and +3, respectively. Thus, electric charge of a subunit including In, Zn, and Ga is 0. Thus, the total electric charge of a layered structure having a combination of such subunits is always 0.

The group included in the layered structure of the In—Ga—Zn—O-based material is not limited to the first group illustrated in FIGS. 10A to 10C and the second group illustrated in FIGS. 11A to 11C, and a group having various combinations of atoms can be used. For example, as illustrated in FIGS. 10A to 10C and FIGS. 11A to 11C, it is sufficient that the oxide semiconductor film has a structure which has c-axis alignment and a triangle or hexagonal atomic arrangement when seen from the direction of an a-b plane, a surface, or an interface and in which metal atoms are arranged in a layered manner along the c-axis or metal atoms and oxygen atoms are arranged in a layered manner along the c-axis. In addition, one unit is not limited to the structure including three first groups or three second groups and can have various combinations.

By using the above-described CAAC oxide semiconductor film, the field-effect mobility of the transistor can be higher than or equal to 30 cm$^2$/Vs.

Here, a method for forming the CAAC oxide semiconductor film is described.

First, an oxide semiconductor film is formed by a sputtering method, a molecular beam epitaxy method, an atomic layer deposition method, a pulsed laser deposition method, or the like. Note that by forming an oxide semiconductor film while keeping the substrate 200 provided with the p-channel transistor and/or the n-channel transistor at high temperature, the ratio of a crystalline portion to an amorphous portion can be high. At this time, the temperature of the substrate 200 provided with the p-channel transistor and/or the n-channel transistor may be, for example, higher than or equal to 150° C. and lower than or equal to 450° C., preferably higher than or equal to 200° C. and lower than or equal to 350° C.

Here, the formed oxide semiconductor film may be subjected to heat treatment. By the heat treatment, the ratio of a crystalline portion to an amorphous portion can be high. The temperature of the semiconductor substrate 200 provided with the p-channel transistor and/or the n-channel transistor at the heat treatment is, for example, higher than or equal to 200° C. and lower than a temperature at which the semiconductor substrate 200 provided with the p-channel transistor and/or the n-channel transistor is changed in quality or shape, preferably higher than or equal to 250° C. and lower than or equal to 450° C. The time for the heat treatment may be longer than or equal to 3 minutes, and preferably shorter than or equal to 24 hours. This is because when the time for the heat treatment is increased, the ratio of a crystalline portion to an amorphous portion can be high; however, the productivity is decreased. Note that the heat treatment may be performed in an oxidation atmosphere or an inert atmosphere; however, there is no limitation thereon. This heat treatment may also be performed under a reduced pressure.

The oxidation atmosphere is an atmosphere containing an oxidizing gas. As an example of the oxidizing gas, for example, oxygen, ozone, and nitrous oxide can be given. It is preferable that components (e.g., water and hydrogen) which are not preferably contained in the oxide semiconductor film be removed from the oxidation atmosphere as much as possible. For example, the purity of oxygen, ozone, or nitrous oxide is higher than or equal to 8N (99.999999%), preferably higher than or equal to 9N (99.9999999%).

The oxidation atmosphere may contain an inert gas such as a rare gas. Note that the oxidation atmosphere contains an oxidizing gas at a concentration of higher than or equal to 10 ppm.

Note that an inert atmosphere contains an inert gas (a nitrogen gas, a rare gas, or the like) and contains a reactive gas such as an oxidizing gas at a concentration of lower than 10 ppm.

Note that a rapid thermal anneal (RTA) apparatus may be used for all the heat treatments. With the use of an RTA apparatus, only in a short time, the heat treatments can be performed at high temperature. Thus, the oxide semiconductor film in which the ratio of a crystalline portion to an amorphous portion is high can be formed and a decrease in productivity can be suppressed.

However, the apparatus used for all the heat treatments is not limited to an RTA apparatus; for example, an apparatus provided with a unit that heats an object to be processed by thermal conduction or thermal radiation from a resistance heater or the like may be used. For example, an electric furnace or a rapid thermal anneal (RTA) apparatus such as a gas rapid thermal anneal (GRTA) apparatus or a lamp rapid thermal anneal (LRTA) apparatus can be given as the heat treatment apparatus used for all the heat treatments. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object to be processed using a high-temperature gas as a heating medium. Here, the temperature of the high-temperature gas is preferably higher than the heating temperature of the object to be processed.

With the use of an In—Ga—Zn—O-based metal oxide in which the nitrogen concentration is higher than or equal to $1 \times 10^{17}$ atoms/cm$^3$ and lower than or equal to $5 \times 10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

In order to form an In—Sn—Zn—O-based metal oxide, for example, a target in which the atomic ratio of In:Sn:Zn is 1:2:2, 2:1:3, 1:1:1, or 20:45:35 may be used.

As described above, the CAAC oxide semiconductor film can be formed.

The CAAC oxide semiconductor film has high orderliness of a bond between metal and oxygen as compared to an oxide semiconductor film having an amorphous structure. In other words, in the case of an oxide semiconductor film having an amorphous structure, the number of oxygen atoms coordinated around a metal atom may vary according to the kind of an adjacent metal. In contrast, in the case of the CAAC oxide semiconductor film, the number of oxygen atoms coordinated around a metal atom is substantially the same. Thus, an oxygen vacancy is hardly observed even at a microscopic level, and electric charge transfer and instability of electric conductivity due to hydrogen atoms (including hydrogen ions), alkali metal atoms, or the like can be suppressed.

Thus, when a transistor in which a channel formation region is formed using a CAAC oxide semiconductor is formed, the amount of change in the threshold voltage of the transistor before and after light irradiation or a bias-temperature stress (BT) test performed on the transistor can be suppressed, and the transistor can have stable electric characteristics.

Next, a second etching mask is formed over the oxide semiconductor film and etching is performed, whereby the oxide semiconductor layer 211 is formed (FIG. 7A).

Then, the source electrode 212a and the drain electrode 212b which are separated from each other and in contact with the oxide semiconductor layer 211 are formed (FIG. 7B).

The source electrode 212a and the drain electrode 212b may be selectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an ink-jet method may be used. Note that the conductive film to be the source electrode 212a and the drain electrode 212b may be formed with a single-layer structure or a structure in which a plurality of layers are stacked. The conductive film may be formed to have a three-layer structure in which an Al layer is sandwiched between Ti layers, for example. Note that the source electrode 212a and the drain electrode 212b also serve as signal lines.

Then, the gate insulating film 213 is formed over at least the channel formation region of the oxide semiconductor layer 211 (FIG. 7C).

As the gate insulating film 213, a film may be formed by, for example, a sputtering method using an insulating material (e.g., silicon nitride, silicon nitride oxide, silicon oxynitride, or silicon oxide). Note that the gate insulating film 213 may be formed to have either a single-layer structure or a stacked-layer structure including a plurality of layers. A stacked-layer structure of two layers in which a silicon oxynitride layer is stacked over a silicon nitride layer is employed here, for example. Note that in the case where the gate insulating film 213 is formed by a sputtering method, hydrogen and moisture can be prevented from entering the oxide semiconductor layer 211. The gate insulating film 213 is preferably an insulating oxide film, in which case oxygen is supplied to the oxide semiconductor layer to fill the oxygen vacancies.

Further, "silicon nitride oxide" contains more nitrogen than oxygen. Note that "silicon oxynitride" contains more oxygen than nitrogen.

Note that the processing of the oxide semiconductor film may be performed by dry etching. For example, a chlorine gas or a mixed gas of a boron trichloride gas and a chlorine gas may be used as an etching gas used for the dry etching. However, there is no limitation thereon; wet etching may be used or another method capable of processing the oxide semiconductor film may be used.

The gate insulating film 213 contains oxygen at least in a portion in contact with the oxide semiconductor layer 211 and is preferably formed using an insulating oxide from which part of oxygen is released by heating. In other words, the materials given as the material of the interlayer insulating film 205 are preferably used. When the portion of the gate insulating film 213 which is in contact with the oxide semiconductor layer 211 is formed using silicon oxide, oxygen can be diffused to the oxide semiconductor layer 211 and a reduction in the resistance of the transistor can be prevented.

Note that the gate insulating film 213 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, yttrium oxide, or lanthanum oxide, whereby gate leakage current can be reduced. Here, gate leakage current refers to leakage current which flows between a gate electrode and a source or drain electrode. Further, a layer formed using the high-k material and a layer formed using silicon oxide, silicon oxynitride, silicon nitride, silicon nitride oxide, aluminum oxide, aluminum oxynitride, or gallium oxide may be stacked. Note that even in the case where the gate insulating film 213 has a stacked-layer structure, the portion in contact with the oxide semiconductor layer 211 is preferably formed using an insulating oxide.

The gate insulating film 213 may be formed by a sputtering method. The thickness of the gate insulating film 213 is greater than or equal to 1 nm and less than or equal to 300 nm, preferably greater than or equal to 5 nm and less than or equal to 50 nm. When the thickness of the gate insulating film 213 is greater than or equal to 5 nm, gate leakage current can be particularly reduced.

Further, third heat treatment (preferably at a temperature of higher than or equal to 200° C. and lower than or equal to 400° C., for example, at a temperature of higher than or equal to 250° C. and lower than or equal to 350° C.) may be performed in an inert gas atmosphere or an oxygen gas atmosphere. Hydrogen or moisture contained in the oxide semiconductor layer 211 can be diffused to the gate insulating film by the third heat treatment. Through the third heat treatment, oxygen can be supplied from the gate insulating film 213 to the oxide semiconductor layer 211.

The third heat treatment may be performed not only after the gate insulating film 213 is formed over the oxide semiconductor layer 211 but also after the gate electrode 214 or a conductive film to be the gate electrode 214 is formed.

The concentration of hydrogen in the oxide semiconductor layer 211 is preferably lower than or equal to $5.0 \times 10^{19}$ atoms/cm$^3$, more preferably lower than or equal to $5.0 \times 10^{18}$ atoms/cm$^3$.

Then, a conductive film is formed over the gate insulating film 213, a third etching mask is formed over the conductive film, and etching is performed, whereby the gate electrode 214 is formed (FIG. 7D). Note that the gate electrode is at least included in the scan line.

The gate electrode 214 may be formed using the same material and method as those of the source electrode 212a and the drain electrode 212b.

Although not illustrated, it is preferable that dopant be added to the oxide semiconductor layer 211 using the gate electrode 214 as a mask to form a source region and a drain region. The dopant may be added by an ion implantation method or an ion doping method. Alternatively, the dopant may be added by performing plasma treatment in an atmosphere of a gas containing the dopant. As the added dopant, a rare gas, nitrogen, phosphorus, arsenic, or the like may be used.

Note that in the case where the third etching mask is formed using a resist material, the third etching mask may be removed only by ashing.

Note that here, the dopant may be added by an ion implantation method or an ion doping method. Alternatively, the dopant may be added by performing plasma treatment in an atmosphere of a gas containing the dopant. As the added dopant, a rare gas, nitrogen, phosphorus, arsenic, or the like may be used.

As described above, the transistor in which the channel formation region is formed using the oxide semiconductor layer can be manufactured over the transistor formed using the semiconductor substrate as illustrated in FIG. 6.

In addition, in the transistor manufactured as described above, the off-state current per micrometer in channel width at room temperature can be lower than or equal to 10 aA/μm ($1\times10^{-17}$ A/μm), lower than or equal to 1 aA/μm ($1\times10^{-18}$ A/μm), further lower than or equal to 1 zA/μm ($1\times10^{-21}$ A/μm), still further lower than or equal to 1 yA/μm ($1\times10^{-24}$ A/μm).

Note that when a conductive film for at least one of the scan line and the signal line is formed using copper, the wiring has low resistance, which is preferable.

The transistor described in this embodiment as a transistor in which a channel fat nation region is formed using an oxide semiconductor layer is an example, and without limitation thereon, various modes can be employed for the transistor in which a channel formation region is formed using an oxide semiconductor layer.

Embodiment 2

The actually measured field-effect mobility of an insulated gate transistor can be lower than its original mobility because of a variety of reasons; this phenomenon occurs not only in the case of using an oxide semiconductor.

One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility is expressed as a formula A in FIG. 12A.

Here, E represents the height of the potential barrier, k represents the Boltzmann constant, and T represents the absolute temperature.

When the potential barrier is assumed to be attributed to a defect, the height of the potential barrier is expressed as a formula B in FIG. 12B according to the Levinson model.

Here, e represents the elementary electric charge, N represents the average defect density per unit area in a channel, ∈ represents the dielectric constant of the semiconductor, n represents the number of carriers per unit area in the channel, $C_{ox}$ represents the capacitance per unit area, $V_g$ represents the gate voltage, and t represents the thickness of the channel.

In the case where the thickness of the semiconductor layer is less than or equal to 30 nm, the thickness of the channel may be regarded as being the same as the thickness of the semiconductor layer.

The drain current $I_d$ in a linear region is expressed as a formula C in FIG. 12C.

Here, L represents the channel length and W represents the channel width, and L and W are each 10 μm in this case.

In addition, $V_d$ represents the drain voltage.

When dividing both sides of the formula C by $V_g$ and then taking logarithms of both sides, a formula D in FIG. 12D can be obtained.

The right side of the formula C is a function of $V_g$.

From the formula, it is found that the defect density N can be obtained from the slope of a line in a graph that is obtained by plotting actual measured values with $\ln(I_d/V_g)$ as the vertical axis and $1/V_g$ as the horizontal axis.

That is, the defect density can be evaluated from the $I_d$-$V_g$ characteristics of the transistor.

The defect density N of an oxide semiconductor in which the ratio of indium (In), tin (Sn), and zinc (Zn) is 1:1:1 is approximately $1\times10^{12}/cm^2$.

On the basis of the defect density obtained in this manner, or the like, $\mu_0$ can be calculated to be 120 cm$^2$/Vs.

The measured mobility of an In—Sn—Zn oxide including a defect is approximately 35 cm$^2$/Vs.

However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at an interface between a channel and a gate insulating film affects the transport property of the transistor. In other words, the mobility pi at a position that is distance x away from the interface between the channel and the gate insulating film can be expressed as a formula E of FIG. 12E.

D represents the electric field in the gate direction, and B and G are constants. B and G can be obtained from actual measurement results; according to the above measurement results, B is $4.75\times10^7$ cm/s and G is 10 nm (the depth to which the influence of interface scattering reaches).

When D is increased (i.e., when the gate voltage is increased), the second term of the right side of the formula E is increased and accordingly the mobility pi is decreased.

Figure 13:
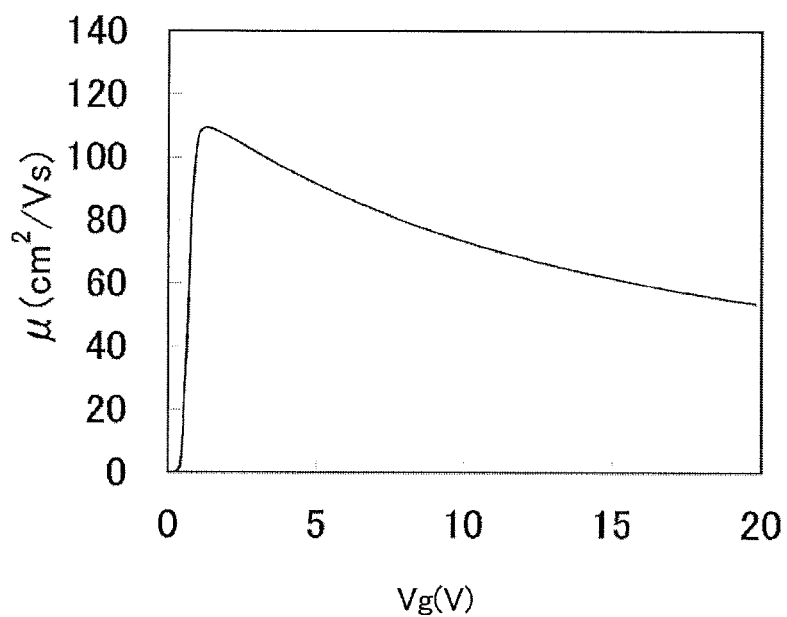
FIG. 13 is a graph showing a relation between gate voltage and field-effect mobility.

Calculation results E of the mobility $\mu_2$ of a transistor whose channel includes an ideal oxide semiconductor without a defect inside the semiconductor are shown in FIG. 13.

For the calculation, Sentaurus Device which is software manufactured by Synopsys, Inc. was used.

For the calculation, the band gap, the electron affinity, the relative dielectric constant, and the thickness of the oxide semiconductor were assumed to be 2.8 eV, 4.7 eV, 15, and 15 nm, respectively.

These values were obtained by measurement of a thin film that was formed by a sputtering method.

Further, the work functions of a gate, a source, and a drain were assumed to be 5.5 eV, 4.6 eV, and 4.6 eV, respectively.

The thickness of a gate insulating film was assumed to be 100 nm, and the relative dielectric constant thereof was assumed to be 4.1. The channel length and the channel width were each assumed to be 10 μm, and the drain voltage $V_d$ was assumed to be 0.1 V.

As shown by the calculation results E, the mobility has a peak of greater than or equal to 100 cm$^2$/Vs at a gate voltage that is a little over 1 V and is decreased as the gate voltage becomes higher because the influence of interface scattering is increased.

Note that in order to reduce interface scattering, it is desirable that a surface of the semiconductor layer be flat at the atomic level (atomic layer flatness).

Characteristics of minute transistors which are manufactured using an oxide semiconductor having such a mobility were calculated.

The transistor used for calculation includes a channel formation region provided between a pair of n-type semiconductor regions in the oxide semiconductor layer.

The calculation was performed under the condition that the resistivity of the pair of n-type semiconductor regions is $2\times10^{-3}$ Ωcm.

The calculation was performed under the condition that the channel length was 33 nm and the channel width was 40 nm.

Further, a sidewall is provided on the side wall of the gate electrode.

The calculation was performed under the condition that part of the semiconductor region which overlaps with the sidewall is an offset region.

For the calculation, Sentaurus Device which is software manufactured by Synopsys, Inc. was used.

Figure 14A:
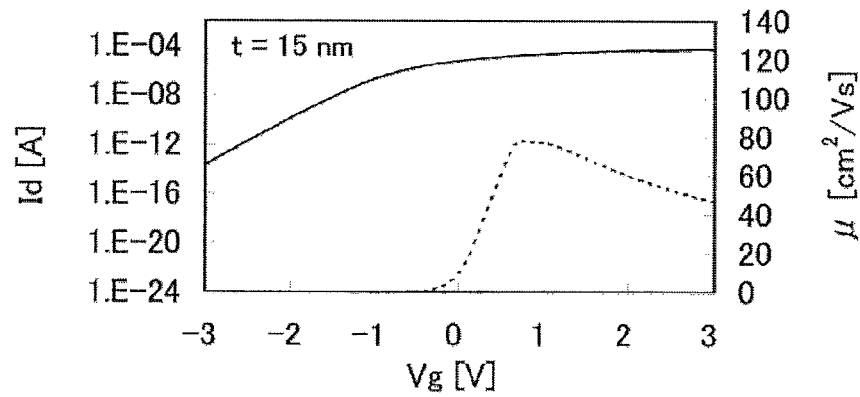
FIGS. 14A to 14C are graphs each showing a relation between gate voltage and drain current.
Figure 14B:
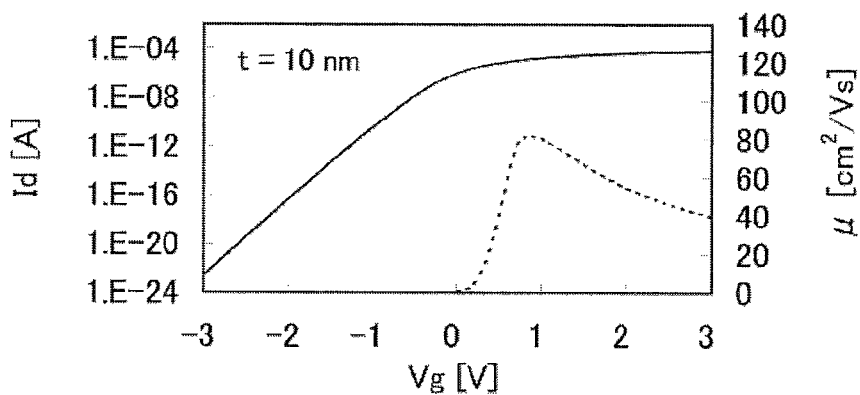
Figure 14C:
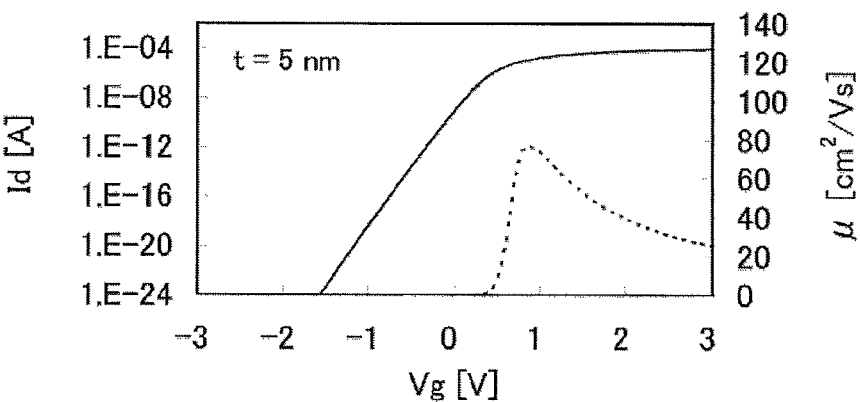

FIGS. 14A to 14C are calculation results of the gate voltage ($V_g$: a potential difference between the gate and the source) dependence of the drain current ($I_d$, solid line) and the mobility (m, dotted line) of the transistor.

The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 14A shows the calculation result under the condition that the thickness of the gate insulating film is 15 nm.

FIG. 14B shows the calculation result under the condition that the thickness of the gate insulating film is 10 nm.

FIG. 14C shows the calculation result under the condition that the thickness of the gate insulating film is 5 nm.

As the gate insulating film is thinner, the drain current $I_d$ (off-state current) particularly in an off state is significantly decreased.

In contrast, there is no noticeable change in the peak value of the mobility μ and the drain current $I_d$ in an on state (on-state current).

Figure 15A:
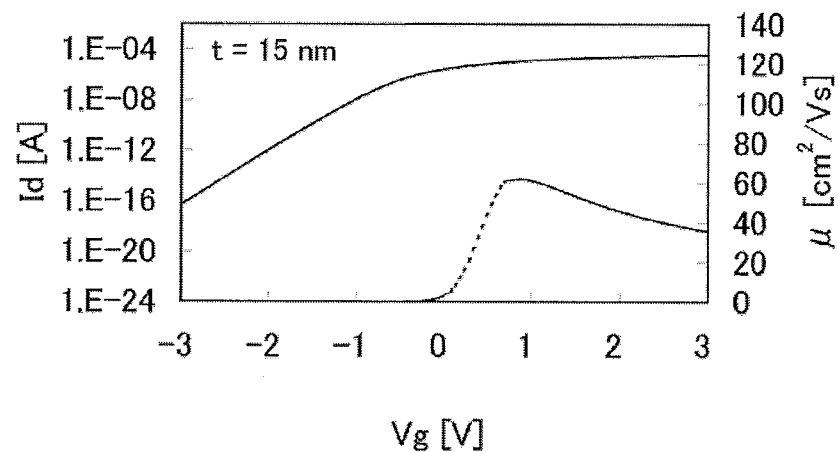
FIGS. 15A to 15C are graphs each showing a relation between gate voltage and drain current.
Figure 15B:
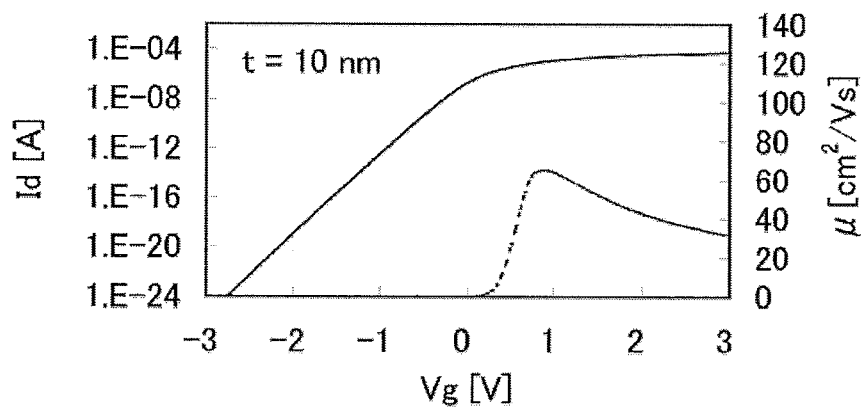
Figure 15C:
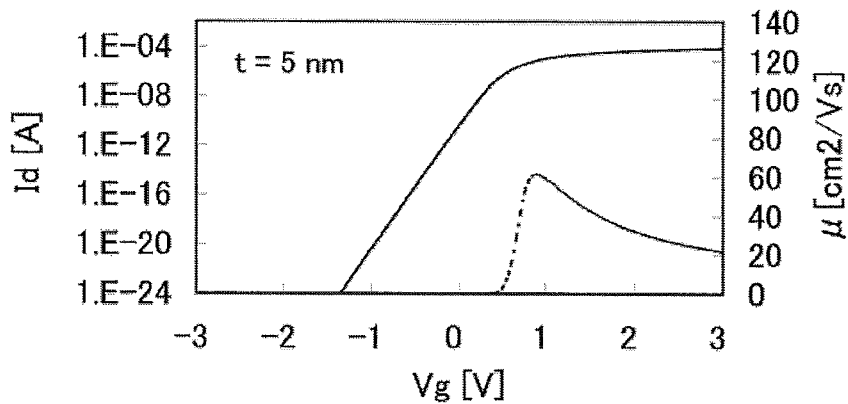

FIGS. 15A to 15C show the gate voltage $V_g$ dependence of the drain current $I_d$ (a solid line) and the mobility μ (a dotted line) of the transistor where the offset length (the sidewall length) $L_{off}$ is 5 nm.

The drain current $I_d$ is obtained by calculation under the assumption that the drain voltage is +1 V and the mobility μ is obtained by calculation under the assumption that the drain voltage is +0.1 V.

FIG. 15A shows the calculation result under the condition that the thickness of the gate insulating film is 15 nm.

FIG. 15B shows the calculation result under the condition that the thickness of the gate insulating film is 10 nm.

FIG. 15C shows the calculation result under the condition that the thickness of the gate insulating film is 5 nm.

Figure 16A:
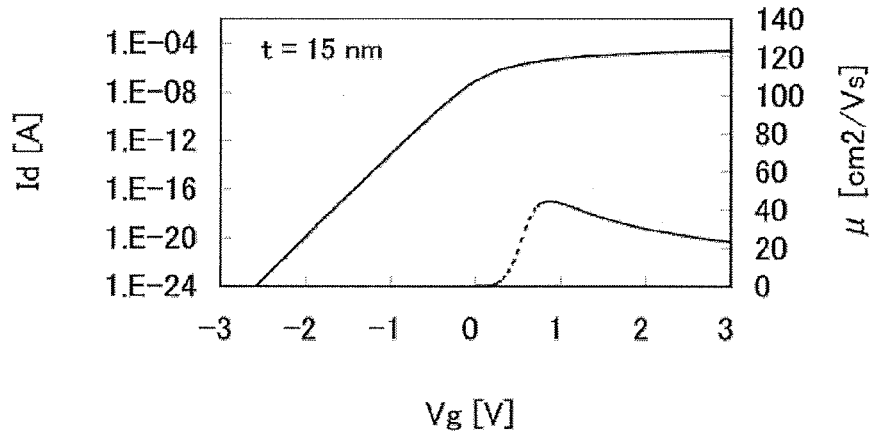
FIGS. 16A to 16C are graphs each showing a relation between gate voltage and drain current.
Figure 16B:
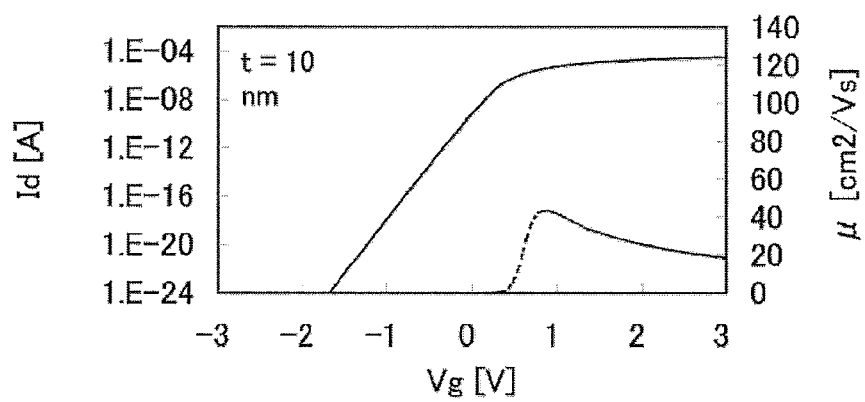
Figure 16C:
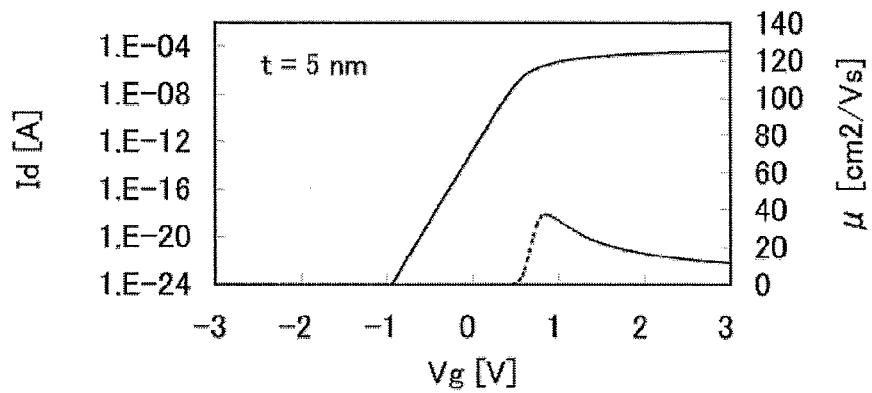

FIGS. 16A to 16C show the gate voltage dependence of the drain current $I_d$ (a solid line) and the mobility μ (a dotted line) of the transistor where the offset length (sidewall length) $L_{off}$ is 15 nm.

The drain current $I_d$ is obtained by calculation under the assumption that the drain voltage is +1 V and the mobility μ is obtained by calculation under the assumption that the drain voltage is +0.1 V.

FIG. 16A shows the calculation result under the condition that the thickness of the gate insulating film is 15 nm.

FIG. 16B shows the calculation result under the condition that the thickness of the gate insulating film is 10 nm.

FIG. 16C shows the calculation result under the condition that the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 14A to 14C, approximately 60 cm²/Vs in FIGS. 15A to 15C, and approximately 40 cm²/Vs in FIGS. 16A to 16C; thus, the peak of the mobility μ is decreased as the offset length $L_{off}$ is increased.

Further, the same applies to the off-state current.

The on-state current is decreased as the offset length $L_{off}$ is increased; however, the decrease in the on-state current is much more gradual than the decrease in the off-state current.

Further, the graphs show that in either of the structures, the drain current exceeds 10 μA, which is required in a memory element and the like, at a gate voltage of around 1 V. The contents of this embodiment or part thereof can be implemented in combination with any of the other embodiments and an example.

Example 1

A transistor including an oxide semiconductor containing hi, Sn, and Zn can have favorable characteristics by forming the oxide semiconductor while heating a substrate or by heat treatment after forming an oxide semiconductor film.

Note that each of In, Sn, and Zn is preferably contained at greater than or equal to 5 at. %.

By heating the substrate after forming the oxide semiconductor film containing In, Sn, and Zn, the field-effect mobility of the transistor can be improved.

The threshold voltage of an n-channel transistor can be shifted in the positive direction.

When the threshold voltage of the n-channel transistor is shifted in the positive direction, an absolute value of voltage for holding an off state of the n-channel transistor can be decreased, and power consumption can be reduced.

Further, when the threshold voltage of the n-channel transistor is shifted in the positive direction, and the threshold voltage is greater than or equal to 0 V, a normally-off transistor can be formed.

Characteristics of transistors including the oxide semiconductor containing In, Sn, and Zn are described below.
(Common Conditions for Samples A to C)

An oxide semiconductor layer was formed over a substrate to have a thickness of 15 nm under the following conditions: a target having a composition ratio of In:Sn:Zn=1:1:1 was used; the gas flow rate was Ar/$O_2$=6/9 sccm; the deposition pressure was 0.4 Pa; and the deposition power was 100 W.

Next, the oxide semiconductor layer was etched into an island shape.

Then, a tungsten layer was formed over the oxide semiconductor layer to have a thickness of 50 nm, and was etched, so that a source electrode and a drain electrode were formed.

Next, a silicon oxynitride (SiON) film was formed so as to have a thickness of 100 nm, using a silane gas (SiH$_4$) and dinitrogen monoxide (N$_2$O) by a plasma CVD method, so that a gate insulating layer was formed.

Then, a gate electrode was formed in the following manner: a tantalum nitride film was formed to have a thickness of 15 nm; a tungsten film was formed to have a thickness of 135 nm; and these films were etched.

After that, a silicon oxynitride (SiON) film with a thickness of 300 nm was formed by a plasma CVD method and a polyimide film with a thickness of 1.5 μm was formed, so that an interlayer insulating film was formed.

Next, a pad for measurement was formed in the following manner: a contact hole was formed in the interlayer insulating film; a first titanium film was formed to have a thickness of 50 nm; an aluminum film was formed to have a thickness of 100 nm; a second titanium film was formed to have a thickness of 50 nm; and these films were etched.

As described above, a semiconductor device having a transistor was formed.

(Sample A)

In Sample A, heating was not performed to the substrate during the deposition of the oxide semiconductor layer.

Further, in Sample A, heat treatment was not performed after the deposition of the oxide semiconductor layer before the etching of the oxide semiconductor layer.

(Sample B)

In Sample B, the oxide semiconductor layer was formed with the substrate heated at 200° C.

Further, in Sample B, heat treatment was not performed after the deposition of the oxide semiconductor layer before the etching of the oxide semiconductor layer.

The substrate was heated while the oxide semiconductor layer was formed in order to remove hydrogen serving as a donor in the oxide semiconductor layer.

(Sample C)

In Sample C, the oxide semiconductor layer was formed with the substrate heated at 200° C.

Further, in Sample C, heat treatment in a nitrogen atmosphere was performed at 650° C. for 1 hour and then heat treatment in an oxygen atmosphere was performed at 650° C. for 1 hour after the oxide semiconductor layer was formed before the oxide semiconductor layer was etched.

The reason why the heat treatment was performed at 650° C. in a nitrogen atmosphere for 1 hour is because hydrogen that serves as a donor in the oxide semiconductor layer is removed.

Here, oxygen is also released by the heat treatment for removing hydrogen that serves as a donor in the oxide semiconductor layer, and an oxygen vacancy which serves as a carrier in the oxide semiconductor layer is generated.

Thus, an effect of reducing oxygen vacancies was tried to be obtained by performing heat treatment at 650° C. in an oxygen atmosphere for 1 hour.

(Characteristics of Transistors of Samples a to C)

Figure 17A:
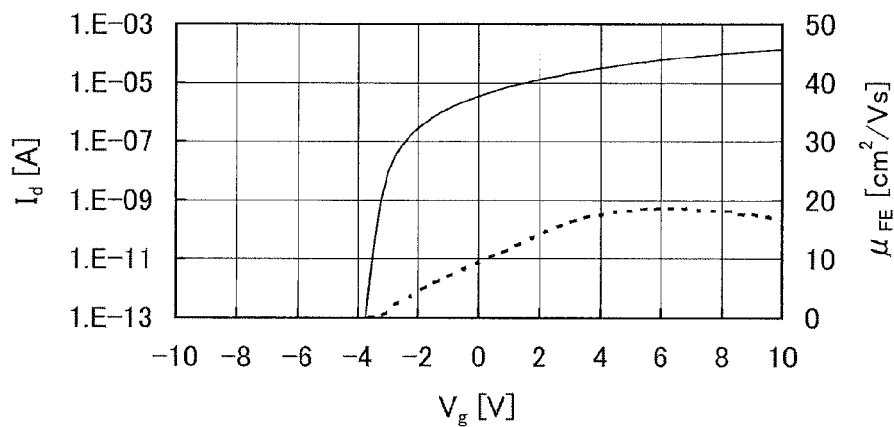
FIGS. 17A to 17C are graphs each showing characteristics of a transistor.

FIG. 17A shows initial characteristics of the transistor of Sample A.

Figure 17B:
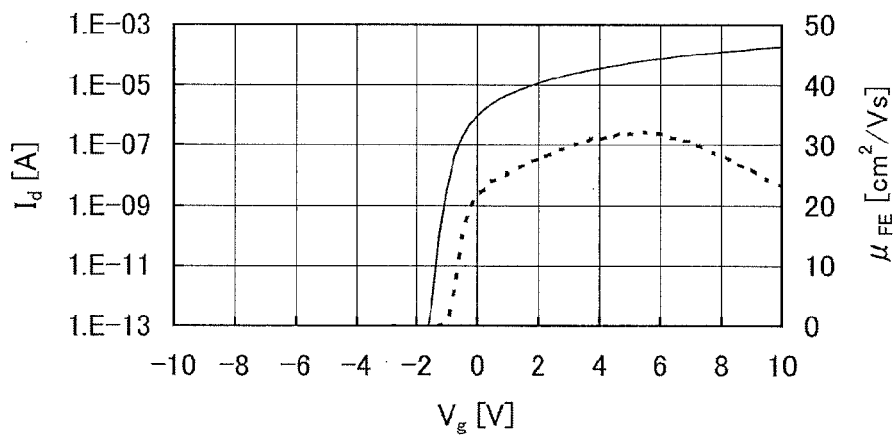

FIG. 17B shows initial characteristics of the transistor of Sample B.

Figure 17C:
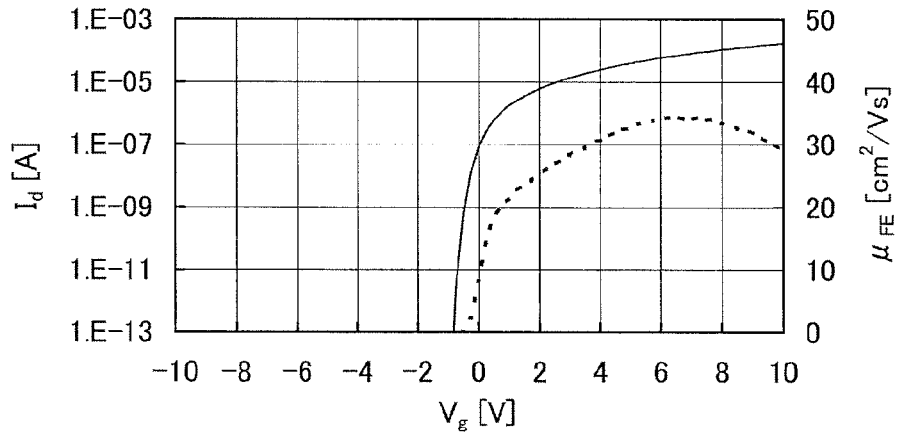

FIG. 17C shows initial characteristics of the transistor of Sample C.

The field-effect mobility of the transistor of Sample A was 18.8 cm$^2$/Vsec.

The field-effect mobility of the transistor of Sample B was 32.2 cm$^2$/Vsec.

The field-effect mobility of the transistor of Sample C was 34.5 cm$^2$/Vsec.

According to observation of cross sections of oxide semiconductor layers which were formed by deposition methods similar to those of Samples A to C, with a transmission electron microscope (TEM), crystallinity was observed in samples formed by the deposition methods similar to those of Sample B and Sample C, substrates of which were heated during deposition.

Further, surprisingly, the sample, the substrate of which was heated during deposition, had a non-crystalline portion and a crystalline portion, and the orientation of the crystalline portion was aligned in the c-axis direction.

In a conventional polycrystal, the orientation of the crystalline portion is not aligned. Thus, it can be said that the sample, the substrate of which was heated during deposition, has a novel structure.

Comparison of FIG. 17A to FIG. 17C shows that heat treatment performed on the substrate during or after deposition can remove a hydrogen element serving as a donor, so that the threshold voltage of the n-channel transistor can be shifted in the positive direction.

That is, the threshold voltage of Sample B, the substrate of which was subjected to heating during deposition, is shifted in the positive direction more than the threshold voltage of Sample A, the substrate of which was not subjected to heating during deposition.

In addition, by comparing Sample B and Sample C, substrates of which were heated during deposition, it is found that the threshold voltage of Sample C on which heat treatment was performed after deposition is shifted in the positive direction more than the threshold voltage of Sample B on which heat treatment was not performed after deposition.

As the temperature of the heat treatment is higher, a light element such as hydrogen is easily removed; therefore, as the temperature of the heat treatment is higher, hydrogen is easily removed.

Accordingly, it can be considered that the threshold voltage can be shifted more in the positive direction by further increasing the temperature of heat treatment during or after the deposition.

(Results of the Gate BT Stress Test of Sample B and Sample C)

The gate BT stress test was performed on Sample B (without heat treatment after deposition) and Sample C (with heat treatment after deposition).

First, $V_g$-$I_d$ characteristics of the transistors were measured at a substrate temperature of 25° C. and $V_d$ of 10 V to measure characteristics of the transistors before heating and high positive voltage application.

Then, the substrate temperature was set to 150° C. and $V_d$ was set to 0.1 V.

After that, 20 V was applied as $V_g$ to the gate insulating film, and was kept for 1 hour.

Next, $V_g$ was set to 0 V.

Then, $V_g$-$I_d$ characteristics of the transistors were measured at a substrate temperature of 25° C. and $V_d$ of 10 V, whereby the characteristics of the transistors after heating and high positive voltage application were measured.

As described above, to compare the characteristics of the transistor before and after heating and high positive voltage application is referred to as a positive BT test.

In a similar manner, $V_g$-$I_d$ characteristics of the transistors were measured at a substrate temperature of 25° C. and $V_d$ of 10 V to measure characteristics of the transistors before heating and high negative voltage application.

Then, the substrate temperature was set to 150° C. and $V_d$ was set to 0.1 V.

Next, −20 V was applied as $V_g$ to the gate insulating film, and was kept for 1 hour.

Next, $V_g$ was set to 0 V.

Then, $V_g$-$I_d$ characteristics of the transistors were measured at a substrate temperature of 25° C. and $V_d$ of 10 V, whereby the characteristics of the transistors after heating and high negative voltage application were measured.

As described above, to compare the characteristics of the transistor before and after heating and high negative voltage application is referred to as a negative BT test.

Figure 18A:
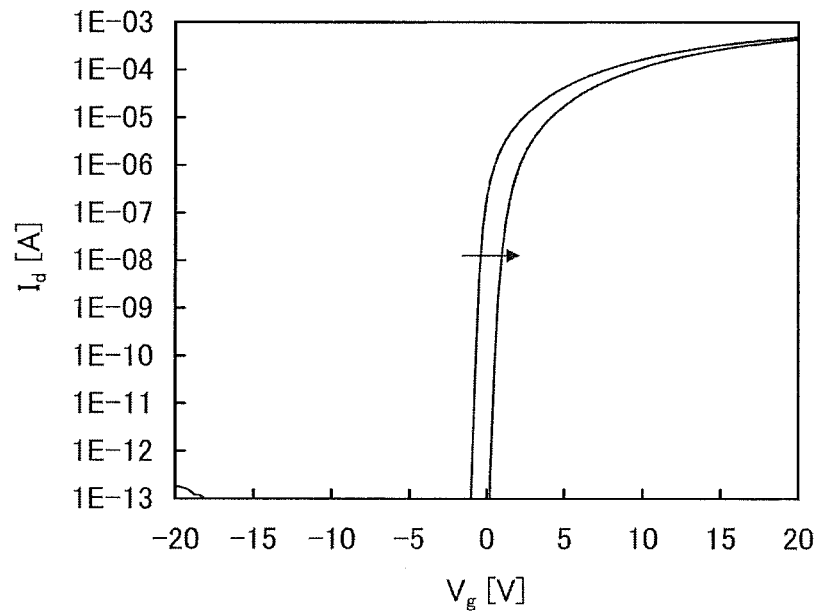
FIGS. 18A and 18B are graphs each showing characteristics of a transistor.
Figure 18B:
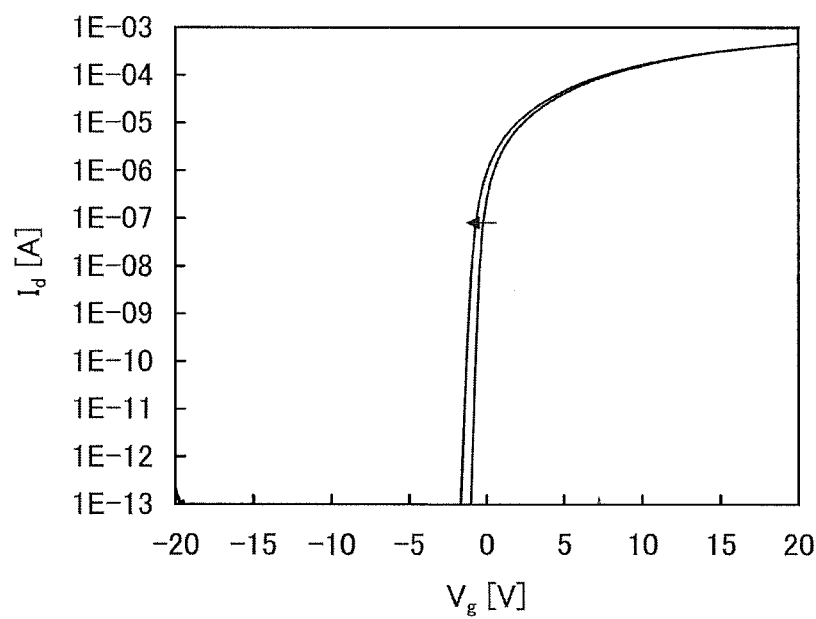

FIG. 18A shows results of the positive BT test of Sample B, and FIG. 18B shows results of the negative BT test of Sample B.

Figure 19A:
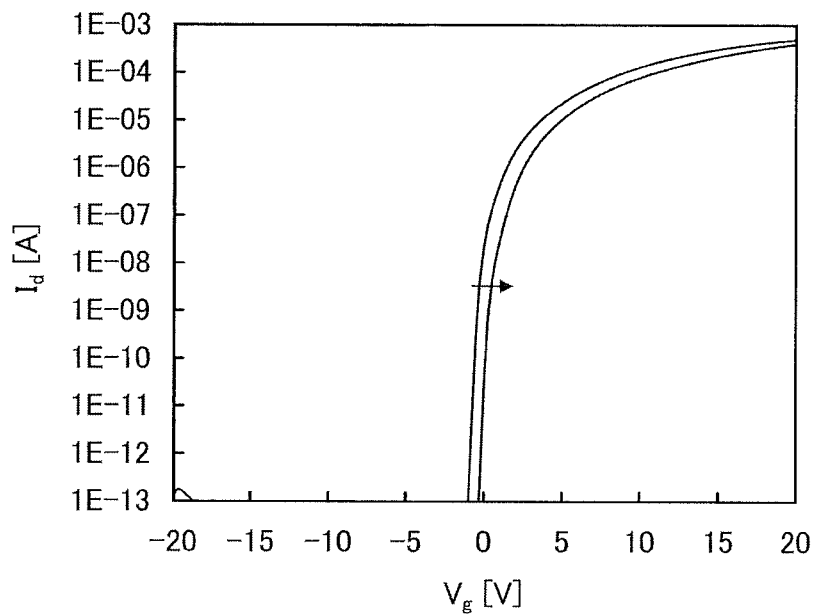
FIGS. 19A and 19B are graphs each showing characteristics of a transistor.
Figure 19B:
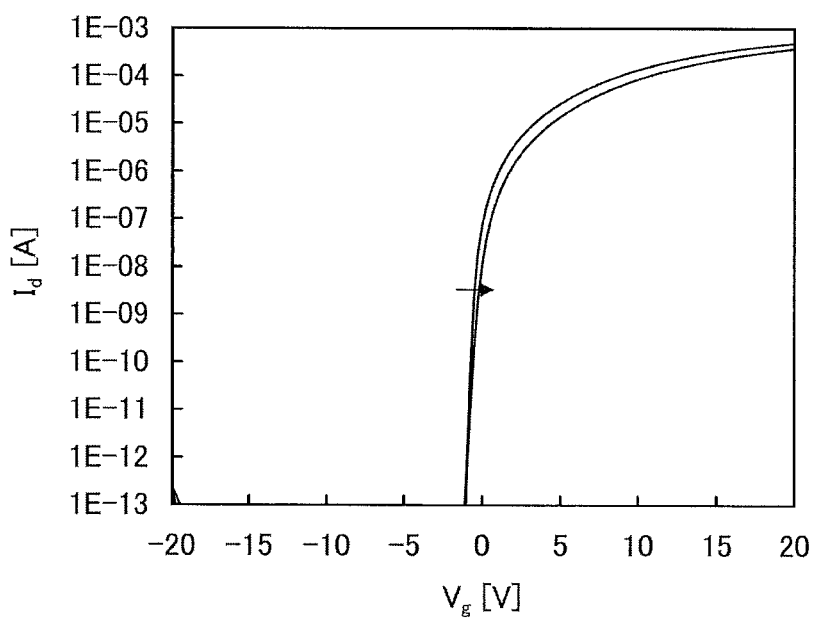

FIG. 19A shows results of the positive BT test of Sample C, and FIG. 19B shows results of the negative BT test of Sample C.

The positive BT test and the negative BT test are tests used to determine deterioration of the transistors; it is found that the threshold voltage can be positively shifted by at least the positive BT tests with reference to FIG. 18A and FIG. 19A.

In particular, it is found in FIG. 18A that the transistor became normally-off when the positive BT test was performed.

Accordingly, it is found that, when the positive BT test as well as the heat treatment at the time of manufacture of the transistors was performed, a positive shift of the threshold voltage can be promoted and a normally-off transistor can be formed.

Figure 20:
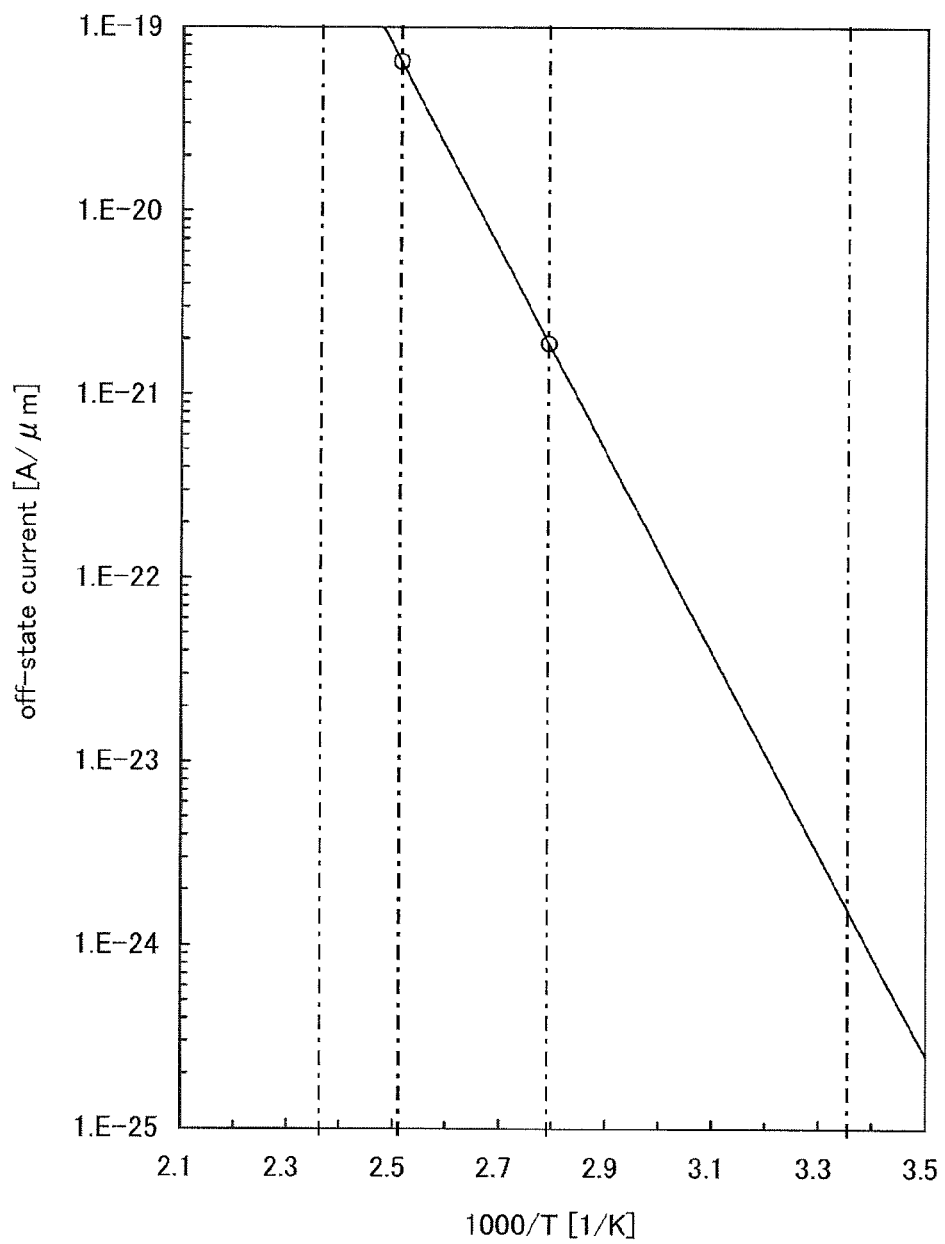
FIG. 20 is a graph showing temperature dependence of off-state current of a transistor.

FIG. 20 shows a relation between the off-state current of the transistor of Sample A and the inverse of the substrate temperature (absolute temperature) at measurement.

Here, the horizontal axis represents a value (1000/T) obtained by multiplying an inverse of the substrate temperature at measurement by 1000.

Note that the amount of current in the case where the channel width is 1 μm is shown in FIG. 20.

The off-state current was less than or equal to $1 \times 10^{-19}$ A when the substrate temperature was 125° C. (1000/T was about 2.51).

The off-state current was less than or equal to $1 \times 10^{-20}$ A when the substrate temperature was 85° C. (1000/T was about 2.79).

In other words, it is found that extremely small off-state current was obtained as compared to a transistor including a silicon semiconductor.

The off-state current is decreased as the temperature is lower; therefore, it is clear that smaller off-state current is obtained at room temperature.

This application is based on Japanese Patent Application serial no. 2011-096222 filed with Japan Patent Office on Apr. 22, 2011, and Japanese Patent Application serial no. 2011-108900 filed with Japan Patent Office on May 14, 2011, the entire contents of which are hereby incorporated by reference.

What is claimed is:

1. A semiconductor device comprising a first memory comprising:
   a first transistor, a second transistor, a third transistor, and a fourth transistor electrically connected to each other in series in order; and
   a fifth transistor, a sixth transistor, a seventh transistor, and an eighth transistor electrically connected to each other in series in order,
   wherein one of a source and a drain of the first transistor and one of a source and a drain of the fifth transistor are electrically connected to a high power supply potential line,
   wherein one of a source and a drain of the fourth transistor and one of a source and a drain of the eighth transistor are electrically connected to a low power supply potential line,
   wherein a gate of the second transistor, a gate of the third transistor, a gate of the sixth transistor, and a gate of the seventh transistor are electrically connected to a first terminal,
   wherein a gate of the fifth transistor and a gate of the eighth transistor are electrically connected to a second terminal,
   wherein the second terminal is electrically connected between the second transistor and the third transistor,
   wherein a gate of the first transistor and a gate of the fourth transistor are electrically connected to a third terminal,
   wherein the third terminal is electrically connected between the sixth transistor and the seventh transistor,
   wherein each of the first transistor and the fifth transistor is a p-channel transistor,
   wherein each of the second transistor, the third transistor, the sixth transistor, and the seventh transistor is a transistor comprising an oxide semiconductor layer, and
   wherein each of the fourth transistor and the eighth transistor is an n-channel transistor.

2. The semiconductor device according to claim 1 further comprising:
   a second memory having a structure similar to that of the first memory;
   a ninth transistor; and
   a tenth transistor,
   wherein one of a source and a drain of the ninth transistor is electrically connected to the third terminal of the first memory,
   wherein one of a source and a drain of the tenth transistor is electrically connected to the second terminal of the first memory, and
   wherein the other of the source and the drain of the tenth transistor is electrically connected to the third terminal of the second memory.

3. The semiconductor device according to claim 2,
   wherein a gate of the ninth transistor is electrically connected to a line to which a clock signal is input,
   wherein a gate of the tenth transistor is electrically connected to a line to which an inversion signal of the clock signal is input, and
   wherein the other of the source and the drain of the ninth transistor is electrically connected to a data input signal line.

* * * * *